United States Patent
Watanabe et al.

(10) Patent No.: US 11,605,530 B2
(45) Date of Patent: Mar. 14, 2023

(54) PLASMA PROCESSING APPARATUS, DATA PROCESSING APPARATUS AND DATA PROCESSING METHOD

(71) Applicant: Hitachi High-Technologies Corporation, Tokyo (JP)

(72) Inventors: Seiichi Watanabe, Tokyo (JP); Satomi Inoue, Tokyo (JP); Shigeru Nakamoto, Tokyo (JP); Kousuke Fukuchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/802,674

(22) Filed: Feb. 27, 2020

(65) Prior Publication Data
US 2020/0203133 A1 Jun. 25, 2020

Related U.S. Application Data

(62) Division of application No. 15/057,158, filed on Mar. 1, 2016, now Pat. No. 10,615,010.

(30) Foreign Application Priority Data

May 12, 2015 (JP) ................................. 2015-097000

(51) Int. Cl.
*H01J 37/32* (2006.01)
(52) U.S. Cl.
CPC .... *H01J 37/32972* (2013.01); *H01J 37/3299* (2013.01); *H01J 37/32192* (2013.01); *H01J 37/32926* (2013.01)

(58) Field of Classification Search
CPC ........... H01J 37/32972; H01J 37/32137; H01J 2237/334; H01J 37/3299; H01J 37/32926;
(Continued)

(56) References Cited

U.S. PATENT DOCUMENTS

| 5,759,424 A | 6/1998 | Imatake et al. |
| 2002/0183868 A1 | 12/2002 | Tabor |

(Continued)

FOREIGN PATENT DOCUMENTS

| JP | 61-053728 | 3/1986 |
| JP | 2000-228397 | 8/2000 |

(Continued)

OTHER PUBLICATIONS

K, Takahashi, "Inside Data Processing", Journal of Surface Analysis, 2000, pp. 68-77, vol. 7, No. 1.

(Continued)

*Primary Examiner* — Yuechuan Yu
(74) *Attorney, Agent, or Firm* — Mattingly & Malur, PC

(57) ABSTRACT

According to an embodiment of the present invention, a plasma processing apparatus includes: a processing chamber in which plasma processing is performed to a sample; a radio frequency power source that supplies radio frequency power for generating plasma in the processing chamber; and a data processing apparatus that performs processing to light emission data of the plasma. The data processing apparatus performs the processing to the light emission by using an adaptive double exponential smoothing method for varying a smoothing parameter based on an error between input data and a predicted value of smoothed data. A response coefficient of the smoothing parameter is derived by a probability density function including the error as a parameter.

4 Claims, 13 Drawing Sheets

(58) Field of Classification Search
CPC .......... H01J 37/32192; H01L 21/67069; G06F 17/18; G06F 17/11
See application file for complete search history.

(56) References Cited

U.S. PATENT DOCUMENTS

| | | |
|---|---|---|
| 2003/0036282 A1 | 2/2003 | Usui et al. |
| 2004/0040658 A1 | 3/2004 | Usui et al. |
| 2006/0037938 A1 | 2/2006 | Yue |
| 2009/0253222 A1 | 10/2009 | Morisawa et al. |
| 2011/0315661 A1 | 12/2011 | Morisawa et al. |
| 2012/0022700 A1 | 1/2012 | Drees et al. |
| 2014/0295583 A1 | 10/2014 | Nakamoto et al. |
| 2015/0024521 A1 | 1/2015 | Fukuchi et al. |

FOREIGN PATENT DOCUMENTS

| | | |
|---|---|---|
| JP | 2004-110300 | 4/2004 |
| JP | 2007-234859 | 9/2007 |
| KR | 95-27918 | 10/1995 |
| KR | 0152355 | 12/1998 |
| KR | 2000-0047790 | 7/2000 |
| KR | 10-2004-0016868 | 2/2004 |
| TW | 200414347 | 8/2004 |
| TW | 201003812 | 1/2010 |
| TW | 201037779 | 10/2010 |
| TW | 201438094 | 10/2014 |
| TW | 201505094 | 2/2015 |

OTHER PUBLICATIONS

A. C. Harvey, "Time series Models", 1993, pp. 172-173.
James W Taylor, "Smooth Transition Exponential Smoothing", Journal of Forecasting, 2004, pp. 385-394, vol. 23.
Peter A. Gorry, "General Least-Squares Smoothing and Differentiation by the Convolution (Savitzky-Golay) Mehtod", Anal. Chem. 1990, pp. 570-573, vol. 62.
Taiwanese Office Action received in corresponding Taiwanese Application No. 105104759 dated Nov. 8, 2016.
Korean Office Action received in corresponding Korean Application No. 10-2016-0007509 dated Feb. 16, 2017.
Japanese Office Action received in corresponding Japanese Application No. 2015097000 dated Sep. 25, 2018.

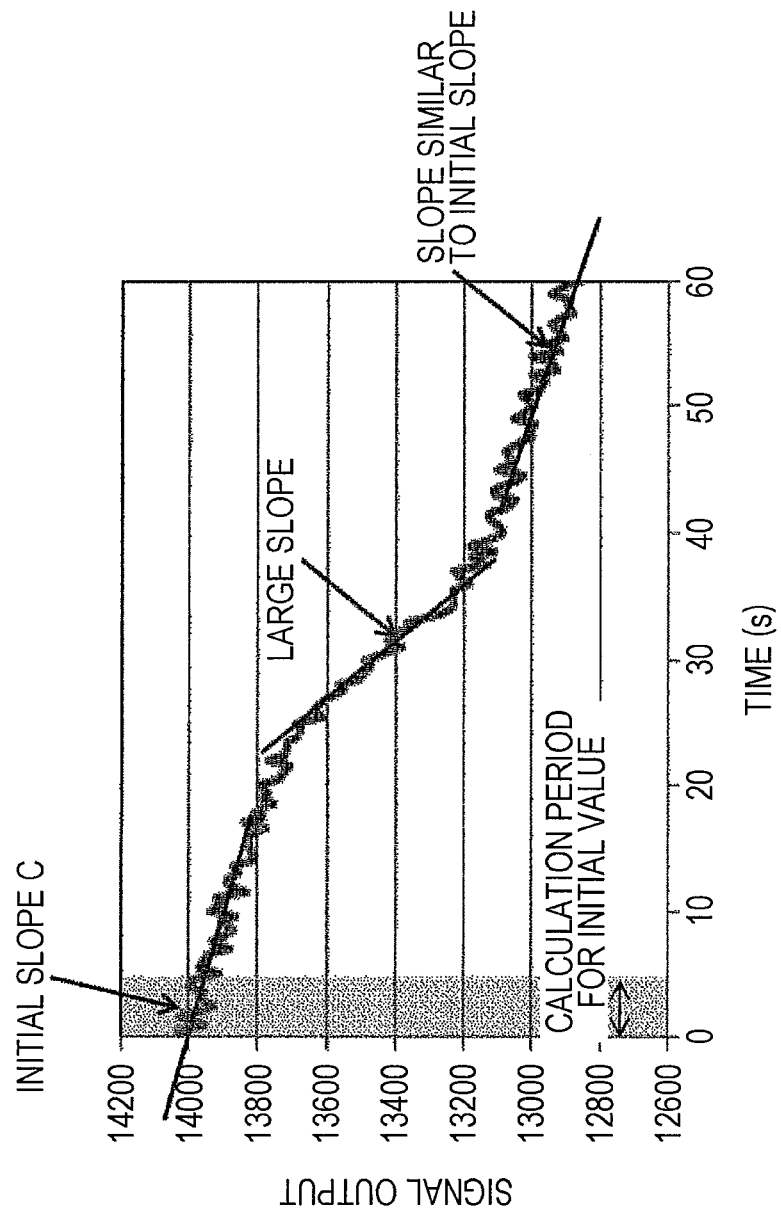

PLASMA PROCESSING APPARATUS, DATA PROCESSING APPARATUS AND DATA PROCESSING METHOD

BACKGROUND OF THE INVENTION

1. Field of the Invention

The present invention relates to a data processing apparatus and a data processing method for a series of numerical data in a system to be an object (for example, apparatus and analytical data).

2. Description of the Related Art

Various models have been proposed as techniques for performing data smoothing and data prediction to a series of numerical data in a system to be an object. For understanding a state of a system to be an object, differential processing, such as a first order differential or a second order differential, is sometimes used in order to detect the extreme values (maximum value and minimum value) that are change points of data, or an inflection point. In particular, in a case of time series data, such as measurement data including for example noise, performing high-precision data smoothing processing and differential processing so as to detect a change point in a system to be an object and to control the system to be an object, has been an important technical problem.

Techniques for performing data smoothing and data prediction in the related art include, for example, a curve fitting method and a moving average method as described in K. Takahashi, "Inside Data Processing", Journal of Surface Analysis, Vol. 7, No. 1, 2000, pp 68-77. Examples of a curve fitting method include a polynomial fitting method (Savitzky-Golay method) as described in JP 2000-228397 A. Examples of a digital filter include Butterworth low pass filter. Examples of a moving average method include an exponential smoothing method as described in A. C. Harvey, "TIME SERIES MODELS", translated by N. Kunitomo and T. Yamamoto, The University of Tokyo Press, 1985, p. 173.

A. C. Harvey, "TIME SERIES MODELS", translated by N. Kunitomo and T. Yamamoto, The University of Tokyo Press, 1985, p. 173 discloses a simple exponential smoothing method (one smoothing parameter) and a double exponential smoothing method (two smoothing parameters). These methods are used in the field of economic relationship, such as supply and demand forecasting. James W Taylor, Journal of Forecasting, 2004, (23), pp 385-394 discloses an adaptive simple exponential smoothing method in which a smoothing coefficient varies in accordance with input data (in particular, sequential input data). A case where the smoothing coefficient varies in accordance with |a relative error/an absolute error| and a case where the smoothing coefficient varies in accordance with a logistic function, have been described. Typically, as expressed by Expressions (1) to (4), a case where a smoothing coefficient varies in accordance with |a relative error/an absolute error|, is sometimes used.

Smoothing of data: $S_{1t+1} = \alpha 1_t Y1_t + (1-\alpha 1_t) S1_t$     Expression (1)

Smoothing coefficient: $\alpha 1_t = |\delta\alpha_t / \Delta\alpha_t|$     Expression (2)

Relative error: $\delta\alpha_t = A1(Y1_t - S1_t) + (1-A1)\delta\alpha_{t-1}$     Expression (3)

Absolute error: $\Delta\alpha_t = A1|Y1_t - S1_t| + (1-A1)\Delta\alpha_{t-1}$     Expression (4)

Here, input data is defined, for example, as time series data $Y1_t$: t=1, 2, ..., and a predicted value of smoothing of data of one-period prediction output is defined as $S_{t+1}$. Symbol A1 denotes an arbitrary constant. Note, each of the symbols is different from each of those in James W Taylor, Journal of Forecasting, 2004, (23), pp 385-394. However, the symbols are described so as to be similar to those in the following embodiments as much as possible.

Techniques for performing data differential processing in the related art, sometimes use a difference method. The polynomial fitting method (Savitzky-Golay method) may be used as described in JP 2000-228397 A and Peter A. Gorry, Anal. Chem. 1990, (62), pp 570-573. Typically, apolynomial fitting method (Savitzky-Golay method) sometimes uses a series of a plurality of pieces of data so as to derive a differential processing result at the center point of a period of the series of a plurality of pieces of data. However, Peter A. Gorry, Anal. Chem. 1990, (62), pp 570-573 discloses a method in which the polynomial fitting method (Savitzky-Golay method) performs data smoothing processing and a first order differential processing at an arbitrary point of data to be used.

As an example of performing data smoothing processing to time series data, such as measurement data including, for example, noise, performing a first order differential processing and a second order differential processing so as to detect a change point of the data, and controlling a system to be an object, JP 1986-53728 A discloses a method for performing data smoothing processing to spectral intensity signal data from plasma emission by moving average processing, and determining an etching end point with a first order differential value and a second order differential value. James W Taylor, Journal of Forecasting, 2004, (23), pp 385-394 discloses a method for estimating an optimum smoothing parameter by minimizing a total sum of errors of a one-period predicted value by the simple exponential smoothing method.

SUMMARY OF THE INVENTION

In a case of data smoothing processing for eliminating noise from data in which the noise is added to an original signal, such as measurement data, increasing an S/N ratio (signal/noise ratio) is one of technical problems. In a case of data differential processing, increasing an S/N ratio (signal/noise ratio) is another of technical problems.

For example, as described in JP 2000-228397 A, in a case where the difference method performs data differential processing and then data smoothing processing is insufficient, an output result of first order differential processing includes much noise. The output result becomes no smooth (flattened) data. An S/N ratio (signal/noise ratio) decreases. When the difference method performs the data differential processing again using the above data again, a result of output of second order differential processing shows that the noise further increases. The result becomes no smooth data. The S/N ratio further decreases. That is, as the data first order differential processing and furthermore data higher order differential processing are performed rather than the data smoothing processing, a technical problem occurs that it is difficult to increase the S/N ratio (signal/noise ratio, hereinafter, referred to as "S/N ratio").

Data processing includes a method for performing processing after acquiring entire data (off-line processing), and a method for performing processing while acquiring data (on-line processing or sequential data processing). In a case of the on-line processing, a data processing result is used in real time and is sometimes applied to, for example, control of a process processing apparatus. Accordingly, causing delay time of the data processing result (time difference with respect to an original processing result) to be small is one of technical problems.

As the data differential processing increases an interval of difference by the difference method, each of an output result of the first order differential processing and an output result of the second order differential processing becomes smooth data, and the S/N ratio increases (note that there is an optimum value for the interval of difference). In a case of the on-line processing of, for example, time series data, there is a problem that the data delay time due to the data differential processing increases. For example, when a low pass filter decreases a cut-off frequency, each of output data of the first order differential processing and output data of the second order differential processing becomes smooth data and the S/N ratio increases (Note that there is an optimum value for the cut-off frequency). There is a problem that the data delay time due to the data differential processing increases, similar to the above.

In a case where a polynomial fitting method (Savitzky-Golay method) performs data differential processing, a series of a plurality of pieces of data is required. A differential value at the center time of a period of the data, is typically derived. Accordingly, in a case of sequential data processing, there is a problem that a time delay theoretically occurs by at least a time difference from time of the latest data to time of the above center data. A case where a differential value is derived when the latest data is acquired by the polynomial fitting method (Savitzky-Golay method) described in Peter A. Gorry, Anal. Chem. 1990, (62), pp 570-573, data delay time decreases when compared to a case where a differential value is derived at the data center point by a typical polynomial curve-fitting method (Savitzky-Golay method). Meanwhile, an S/N ratio decreases.

Accordingly, as the number of data to be used increases, the S/N ratio increases and improves. However, meanwhile, followability (responsiveness) with respect to a sudden change is degraded due to the large number of data. There is a problem that a limit of the responsiveness occurs due to the number of data to be used. More specifically, there is a problem that a radio frequency component included in an original signal has been lost in a signal after data processing.

The Savitzky-Golay method fits a plurality of pieces of data to a quadratic curve or a cubic curve. Accordingly, as the number of data increases, fitting accuracy improves. However, a reason why the above radio frequency component has been lost is because the fitting cannot correspond to a change of the quadratic, cubic curves or more due to a period of the number of data.

JP 1986-53728 A discloses a method for determining an end point of plasma etching in a plasma etching processing apparatus. There are mainly the following two problems with respect to the method for determining an end point of plasma etching disclosed in JP 1986-53728 A.

Current semiconductor devices include a high step structure, such as a fin field effect transistor (Fin FET), due to high performance and high integration. In typical plasma etching, micro loading that is an etching performance difference between a pattern in a sparse portion and a pattern in a dense portion occurs. Furthermore, a film to be etched may be ununiformed in a wafer surface.

According to these, for example, time series data of spectral intensity signal data from plasma emission used for determining the end point of plasma etching, may change by two steps. In a case where, as described above, the time series data of spectral intensity signal data from the plasma emission changes by two steps and the end point of plasma etching is determined by a first change or a second change, the first change and the second change occur during a short period. Therefore, data processing cannot trace the two changes. As a result, the end point of plasma etching cannot be detected. Note that, here, the end point of plasma etching is defined as a point in time at which the time series data of spectral intensity signal data from the plasma emission changes.

For example, in plasma etching during a short period of time with respect to delay time of a first order differential value or a second order differential value, data processing for calculating the first order differential value of the second order differential value, cannot trace a change of the time series data of spectral intensity signal data from the plasma emission. That is, there is a problem that responsiveness for detecting the end point of plasma etching is insufficient.

Next, mask patterns of plasma etching are mainly classified into a groove pattern and a hole pattern. Typically, an aperture ratio of a wafer of the hole pattern is smaller than an aperture ratio of a wafer of the groove pattern, and the aperture ratio may be less than 1%. As the aperture ratio decreases, a change of spectral intensity of the plasma emission decreases.

Accordingly, for example, in a case where a wafer has an aperture ratio of less than 1%, since the change of the time series data of spectral intensity signal data from the plasma emission is significantly small, it is difficult to detect the end point of plasma etching. That is, there is a problem that a low S/N ratio cannot be managed. Note that, here, an aperture ratio is referred a ratio of an area to be etched to an area of an entire wafer.

James W Taylor, Journal of Forecasting, 2004, (23), pp 385-394 discloses the adaptive simple exponential smoothing method in which a smoothing coefficient varies in accordance with input data (in particular, sequential input data). A case where the smoothing coefficient varies in accordance with |a relative error/an absolute error| and a case where the smoothing coefficient varies in accordance with a logistic function, have been described. The smoothing coefficient is a data adaptive type in each of the above two cases. Since the above two cases are based on simple exponential smoothing method, there is a problem that it is difficult to cause an S/N ratio and data responsiveness to be compatible with each other.

In a case where the logistic function is used, it has been estimated that the main reason is because output becomes simply 0 or 1 suitable to a movable range of the smoothing coefficient. A relationship between the smoothing coefficient and an error has not been sufficiently considered. Accordingly, there is a problem that S/N ratio performance of data smoothing processing is not necessarily sufficient. The logistic function includes a plurality of parameters. There is a problem that it is difficult to set the parameters and it is not easy to use the logistic function.

As described above, in the data smoothing processing and the data differential processing, there is a trade-off relationship between S/N ratio performance improvement and data responding performance improvement (shortening of delay time) In a data smoothing processing method and in a data differential processing method, a parameter in each of the data processing methods is required to be optimized in accordance with input data to be an object to which data processing is performed.

In the related art, a parameter of data processing is sequentially changed so as to perform the data processing.

Data processing wave forms, such as a data smoothing processing wave form and a data differential processing wave form, and numerical data, such as an S/N ratio and delay time, each are collectively overlooked so as to find an optimum parameter. However, the above method takes a long time to find the optimum parameter. There is a problem that, for example, knowledge and experience of data processing are required in order to, for example, shorten the time taken for finding the optimum parameter.

James W Taylor, Journal of Forecasting, 2004, (23), pp 385-394 discloses the method for estimating an optimum smoothing parameter by minimizing a total sum of errors of a one-period predicted value by the simple exponential smoothing method. However, this method does not take smoothness of a curve of the predicted values into consideration. Thus, there is a problem that noise is large and an S/N ratio is not excellent in first order differential processing and second order differential processing that detect a change point.

Accordingly, in a plasma processing apparatus including a data processing apparatus that performs processing to data, the data processing apparatus that performs the processing to data, and a data processing method, an object of the present invention is to provide a plasma processing apparatus, a data processing apparatus, and a data processing method that can cause a high S/N ratio and shortening of data delay time or data responsiveness improvement to be compatible with each other. Another object of the present invention is to provide a plasma processing apparatus, a data processing apparatus, and a data processing method that are capable of automatically and simply finding an optimum parameter for performing data smoothing processing and data differential processing to input data.

According to an embodiment of the present invention, in a data processing method in which processing is performed to data by using an adaptive double exponential smoothing method for varying a smoothing parameter in accordance with an error between input data and a predicted value of smoothed data, a responsiveness coefficient of the smoothing parameter is derived by using a probability density function (normal distribution function, Gaussian distribution function) including the errors between the input and the predicted value of smoothed data as a parameter.

According to an embodiment of the present invention, in a data processing method in which processing is performed to data by using an adaptive double exponential smoothing method for varying a smoothing parameter in accordance with an error between input data and a predicted value of smoothed data, an exponential weighted moving average is performed to the error between the input data and the predicted value of smoothed data. A coefficient of the exponential weighted moving average uses an adaptive addition coefficient varying in accordance with a slope of smoothing data.

According to an embodiment of the present invention, in a data processing method in which processing is performed to data by using a double exponential smoothing method, a result of data smoothing processing by a backward Savitzky-Golay method using a series of a plurality of input data, is used as input data in an expression of smoothing of data in the double exponential smoothing method. A result of a first order differential processing by the backward Savitzky-Golay method using a predicted value of smoothing of the series of a plurality of pieces of input data, is used as input data of a slope of a predicted value of smoothing of data in an expression of a slope of smoothing data of double exponential smoothing.

According to an embodiment of the present invention, a plasma processing method in which plasma processing is performed to a sample, includes: measuring light emission data when the plasma processing is performed to the sample, detecting a state of plasma processing of the sample or a change of the state of plasma processing of the sample based on at least one of processing results of a first order differential processing result and a second order differential processing result derived by using a double exponential smoothing method, and controlling the plasma processing of the sample in accordance with the detected result. The double exponential smoothing method includes: using an adaptive double exponential smoothing method for varying a smoothing parameter in accordance with an error between the light emission having been measured and a predicted value of smoothed light emission data; and at least one of: deriving a response coefficient of the smoothing parameter by a probability density function (normal distribution function, Gaussian distribution function) including an error between input data and a predicted value of smoothing of data as a parameter; or performing an exponential weighted moving average to the error between the input data and the predicted value of smoothing of data, and using an adaptive addition coefficient in which a coefficient of the exponential weighted moving average varies in accordance with a predicted value of a slope of smoothing of data; or using a result to which data smoothing processing has been performed by a backward Savitzky-Golay method using a series of a plurality of pieces of input data, as input data in an expression of smoothing of data of the double exponential smoothing method, and furthermore using a result to which a first order differential processing has been performed by the backward Savitzky-Golay method using a predicted value of smoothing of the series of a plurality of pieces of input data, as input data of a slope of the predicted value of smoothing of data in an expression of a slope of smoothing of data of the double exponential smoothing.

According to an embodiment of the present invention, a data processing apparatus includes: a data input/output apparatus for receiving data to which processing is performed, a storage apparatus for storing the data received by the data input/output apparatus, a data processing program storage apparatus for storing a data processing program of a double exponential smoothing method, and a data calculation processing apparatus for performing data processing based on the data processing program. The double exponential smoothing method includes: using an adaptive double exponential smoothing method for varying a smoothing parameter in accordance with an error between input data and a predicted value of smoothing of the input data; and at least one of: deriving a responsiveness coefficient of the smoothing parameter by a probability density function (normal distribution function, Gaussian distribution function) including the error between the input data and the predicted value of smoothing of data as a parameter; or performing an exponential weighted moving average to the error between the input data and the predicted value of smoothing of data, and using an adaptive addition coefficient in which a coefficient of the exponential weighted moving average varies in accordance with a predicted value of a slope of smoothing of data; or using a result to which data smoothing processing has been performed by a backward Savitzky-Golay method using a series of a plurality of pieces of input data, as input data in an expression of smoothing of data of the double exponential smoothing method, and furthermore using a result to which a first order differential processing has been performed by the backward Savitzky-Golay method using a predicted value of smoothing of the series of a plurality of pieces of input data, as input data of a slope of the predicted value of smoothing of data in an expression of a slope of smoothing of data of the double exponential smoothing.

According to an embodiment of the present invention, a processing apparatus includes: a processing chamber to be controlled; a measurement apparatus for acquiring data related to the processing chamber; a data calculation processing apparatus for performing data processing based on a data processing program of a double exponential smoothing method; and a control apparatus for detecting a state of the processing chamber or a change of the state of the processing chamber by using a data processing result derived by the data calculation processing apparatus and for controlling the processing chamber in accordance with the detected result. The double exponential smoothing method includes: using an adaptive double exponential smoothing method for varying a smoothing parameter in accordance with an error between input data and a predicted value of smoothing of the input data; and at least one of: deriving a responsiveness coefficient of the smoothing parameter by a probability density function (normal distribution function, Gaussian distribution function) including the error between the input data and the predicted value of smoothing of data as a parameter; or performing an exponential weighted moving average to the error between the input data and the predicted value of smoothing of data, and using an adaptive addition coefficient in which a coefficient of the exponential weighted moving average varies in accordance with a predicted value of a slope of smoothing of data; or using a result to which data smoothing processing has been performed by a backward Savitzky-Golay method using a series of a plurality of pieces of input data, as input data in an expression of smoothing of data of the double exponential smoothing method, and furthermore using a result to which a first order differential processing has been performed by the backward Savitzky-Golay method using a predicted value of smoothing of the series of a plurality of pieces of input data, as input data of a slope of the predicted value of smoothing of data in an expression of a slope of smoothing of data of the double exponential smoothing.

According to an embodiment of the present invention, a processing apparatus includes: a processing chamber in which plasma processing is performed to a sample disposed on a sample stage; a measurement apparatus for acquiring light emission data when the plasma processing is performed to the sample, a data calculation processing apparatus for performing data processing based on a data processing program of a double exponential smoothing method; and a control apparatus for detecting a state of plasma processing of the sample or a change of the state of plasma processing of the sample by using a data processing result derived by the data calculation processing apparatus and for controlling the processing chamber in accordance with the detected result. The double exponential smoothing method includes: using an adaptive double exponential smoothing method for varying a smoothing parameter in accordance with an error between input data and a predicted value of smoothing of the input data; and at least one of: deriving a responsiveness coefficient of the smoothing parameter by a probability density function (normal distribution function, Gaussian distribution function) including the error between the input data and the predicted value of smoothed data as a parameter; or performing an exponential weighted moving average to the error between the input data and the predicted value of smoothing of data, and using an adaptive addition coefficient in which a coefficient of the exponential weighted moving average varies in accordance with a predicted value of a slope of smoothing of data; or using a result to which data smoothing processing has been performed by a backward Savitzky-Golay method using a series of a plurality of pieces of input data, as input data in an expression of smoothing of data of the double exponential smoothing method, and furthermore using a result to which a first order differential processing has been performed by the backward Savitzky-Golay method using a predicted value of smoothing of the series of a plurality of pieces of input data, as input data of a slope of the predicted value of smoothing of data in an expression of a slope of smoothing of data of the double exponential smoothing.

According to an embodiment of the present invention, a data processing method in which data smoothing processing or data differential processing is performed using a series of a plurality of pieces of discrete numerical data as input data, includes at least one parameter. An evaluation function is the sum of a mean square error between input data and a data smoothing processing result and a value obtained by multiplying a mean square of a second order differential of the data smoothing processing result by an arbitrary numerical value. Minimizing the evaluation function is the index. The parameter of the data processing is derived.

According to an embodiment of the present invention, in a plasma processing apparatus including a data processing apparatus that performs processing to data, the data processing apparatus performing the processing to data, and a data processing method, S/N ratio improvement of a data processing result and responsiveness improvement of the data processing result (shortening of delay time of the data processing result) can be compatible with each other. An optimum parameter of the data processing method can be simply and automatically found in a short time. Accordingly, a processing apparatus including a data processing apparatus, a data processing method, and a control apparatus controlling a processing chamber, can be provided, the processing apparatus having excellent usability.

BRIEF DESCRIPTION OF THE DRAWINGS

FIG. 4 is a graphical representation of an exemplary change of a slope of signal output to be input of data processing;

DESCRIPTION OF THE PREFERRED EMBODIMENTS

Embodiments of the present invention will be described below with reference to the drawings.

First Embodiment

First, a data processing apparatus according to a first embodiment of the present invention will be described using FIGS. 1 to 10. An example in which the present invention has been applied to detection of an etching end point using plasma spectroscopy for high-precision etching processing in a microwave plasma etching apparatus with magnetic field, will be described.

Figure 1:
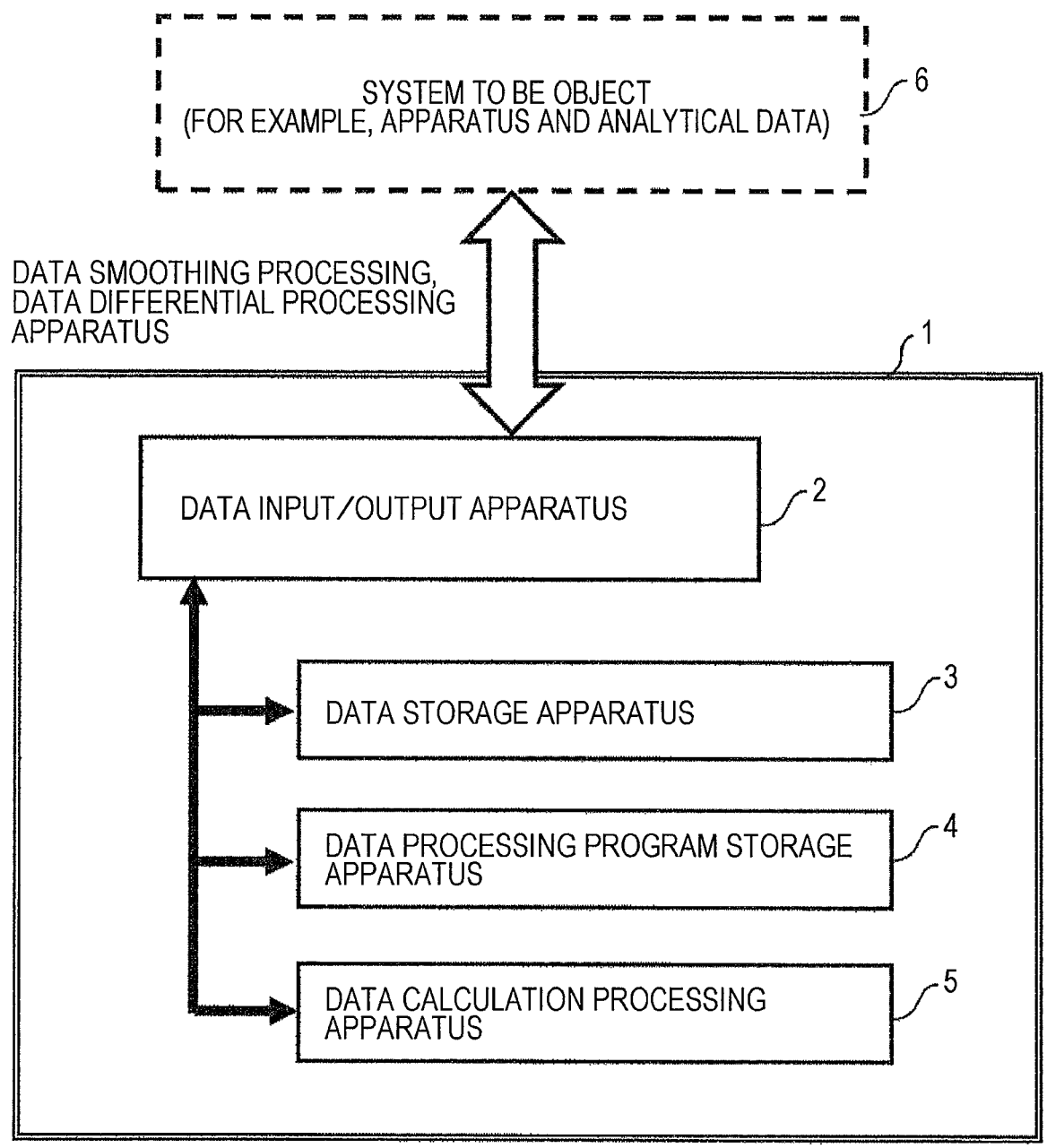
FIG. 1 is a diagram of an entire configuration of a data processing apparatus according to a first embodiment.

FIG. 1 is a diagram of a configuration of the data processing apparatus 1 according to the first embodiment. According to the present embodiment, the data processing apparatus 1 includes a data input/output apparatus 2, a data storage apparatus 3 that is a storage apparatus, a data processing program storage apparatus 4, and a data calculation processing apparatus 5, and is coupled to these apparatuses so as to mutually transmit data.

As necessary, a data display apparatus (not illustrated) is disposed in addition to the above apparatuses. The data processing apparatus 1 can input/output data into/from a system 6 to be an object (for example, apparatus and analytical data). Accordingly, the system 6 to be an object is controlled with high precision. According to the present embodiment, the system 6 to be an object is a microwave plasma processing apparatus. The data processing apparatus 1 may be independently used and can be used for data analysis.

The data input/output apparatus 2 can input/output, for example, processing data and a parameter of a data processing program. The data input/output apparatus 2 collectively or sequentially receives data to be processed from, for example, the system 6 to be an object. The data storage apparatus 3, such as a RAM, stores the data received by the data input/output apparatus 2. The data calculation processing apparatus 5 performs data smoothing processing and data differential processing to the data in accordance with a data processing program stored in the data processing program storage apparatus 4, such as a RAM. After the data calculation by the data calculation processing apparatus 5, the data input/output apparatus 2 outputs data smoothing processing result data and data differential processing result data to the system 6 to be an object. Then, the pieces of data are used in order to control the system 6 to be an object.

Figure 2:
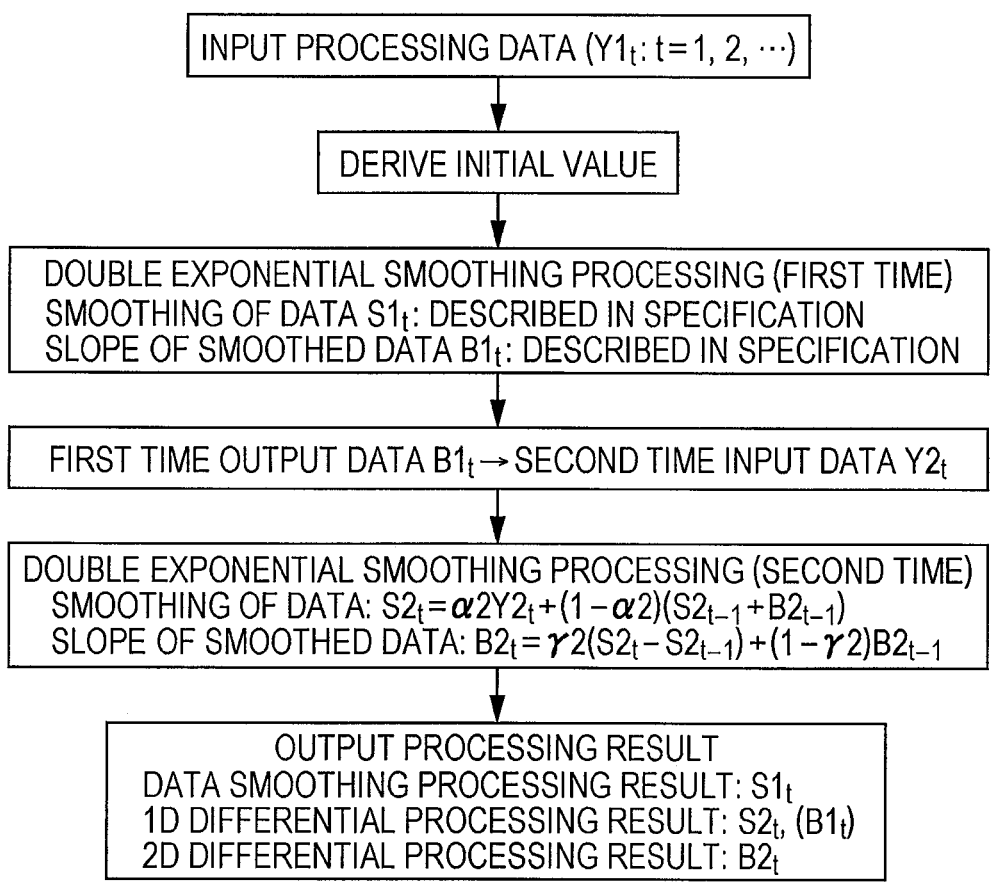
FIG. 2 is a flow chart of data processing according to the first embodiment.

FIG. 2 is a flow chart of an entire flow of a data processing method stored in the data processing program. Data to be processed collectively or sequentially is received and input. The input data is defined as time series data $Y1_t$: $t=1, 2, \ldots$. Next, a method to be described later derives an initial value. Next, first double exponential smoothing processing is performed so as to acquire a predicted value $S1_t$ of smoothing of data of first output and a predicted value $B1_t$ of a slope of smoothed data of the first output.

In this case, the processing is performed by a type I adaptive double exponential smoothing processing method expressed by the following Expressions (5) to (14).

Smoothing data: $S1_t = \alpha1_t Y1_t + (1-\alpha1_t)(S1_{t-1} + B1_{t-1})$    Expression (5)

Slope of smoothed data: $B1_t = \gamma1_t(S1_t - S1_{t-1}) + (1-\gamma1_t)B1_{t-1}$    Expression (6)

Smoothing coefficient: $\alpha1_t = (K_\alpha - L_\alpha)F_\alpha + L_\alpha$    Expression (7)

Response coefficient: $F_{\alpha t} = (|\delta\alpha_t/\Delta\alpha_t| + \varphi)^N$    Expression (8)

Relative error: $\delta\alpha_t = A1(Y1_t - S1_t) + (1-A1)\delta\alpha_{t-1}$    Expression (9)

Absolute error: $\Delta\alpha_t = A1|Y1_t - S1_t| + (1-A1)\Delta\alpha_{t-1} + \varphi$    Expression (10)

Smoothing coefficient: $\gamma1_t = (K_\gamma - L_\gamma)F\gamma + L_\gamma$    Expression (11)

Response coefficient: $F_{\gamma t} = (|\delta\gamma_t/\Delta\gamma_t| + \varphi)^N$    Expression (12)

Relative error: $\delta\gamma_t = A2\{(S1_t - S1_{t-1}) - B1_t\} + (1-A2)\delta\gamma_{t-1}$    Expression (13)

Absolute error: $\Delta\gamma_t = A2|(S1_t - S1_{t-1}) - B1_t| + (1-A2)\Delta\gamma_{t-1} + \varphi$    Expression (14)

Here, the input data is defined as, for example, time series data $Y1_t$: $t=1, 2, \ldots$. The predicted value $S1_t$ of smoothing of data of output and the predicted value Bit of a sloped of smoothed data of the output can be acquired by the sequential data processing. Symbols $K_\alpha$, $L_\alpha$, $K_\gamma$, $L_\gamma$, N, A1, A2, and $\varphi$ are arbitrary constants. Note that, $1 > K_\alpha > L_\alpha > 0$, $1 > K_\gamma > L_\gamma > 0$, $1 > A1 > 0$, and $1 > A2 > 0$ are satisfied. Symbol $\varphi$ serves to prevent the absolute errors $\Delta\alpha_t$ and $\Delta\gamma_t$ or the response coefficients $F_{\alpha t}$ and $F_{\gamma t}$ from becoming zero. An extremely small value is selected as $\varphi$ in order to make less effect with respect to ordinary calculation.

In a case of N=0 in Expressions (8) and (12), the response coefficients $F_\alpha = 1$ and $F_\gamma = 1$ are satisfied and the smoothing coefficients $\alpha_t = K_\alpha$ and $\gamma_t = K_\gamma$ are satisfied so as to be constant. Therefore, in the case of N=0, an ordinary double exponential smoothing method is made. In a case of N=1, there is provided the adaptive double exponential smoothing method in which each of the smoothing coefficients is proportional to a corresponding relative error/absolute error. One of the smoothing coefficients varies in a range between $K_\alpha$ and $L_\alpha$ and the other varies in a range between $K_\gamma$ to $L_\gamma$.

Similarly, in a case of N=5, there is provides the adaptive double exponential smoothing method in which each of the smoothing coefficients is proportional to the fifth power of the corresponding relative error/absolute error. One of the smoothing coefficients varies in a range between $K_\alpha$ and $L_\alpha$ and the other varies in a range between $K_\gamma$ to $L_\gamma$.

In a case where the corresponding relative error/absolute error is small, the adaptive double exponential smoothing method decreases each of the smoothing coefficients so as to improve data smoothing performance. Meanwhile, in a case where the corresponding relative error/absolute error is large, the adaptive double exponential smoothing method increases each of the smoothing coefficients so as to improve data responding performance. There is a trade-off relationship between the data smoothing performance and the data responding performance. A balance between them varies depending on the above value of N. Thus, the above value of N is selected in accordance with a characteristic of the input data.

Next, a method for deriving the above initial value, will be described. Typically, in double exponential smoothing processing, an initial value of the predicted value S1 of smoothing of data and an initial value of the predicted value B1 of a slope of smoothed data are derived by, for example, the following method. The initial value of the predicted value S1 of smoothing of data is derived by, for example, $S1_1$=input data $Y1_1$ (Method A1) or $S1_1$=an average value of initial N pieces of input data ($\{Y1_1+Y1_2+ \ldots +Y1_N\}$/N) (Method A2).

The initial value of the predicted value B1 of a slope of smoothed data is derived by, for example, $B1_1=Y1_2-Y1_1$ (Method B1) or $B2_1=\{(Y1_2-Y1_1)+(Y1_4-Y1_3)\}/2$ (Method B2). Typically, the double exponential smoothing processing has a problem that an error is large immediately after data processing is performed. One of the reasons is that there are large errors between the initial values by the above deriving method in the related art, and a predicted value of smoothing of originally initial data and a predicted value of a slope of originally initial smoothed data.

Here, a least squares method derives a polynomial approximate expression by using initial data $Y1_t$ (t=1, 2, ..., N) after starting to input predetermined N pieces of data. Time series data including initial ten pieces of data with regular time intervals, is used. The polynomial approximate expression derived above derives a predicted value $S1_0$ of smoothing of data and a predicted value $B1_0$ of a slope of smoothed data that are pieces of virtual data at t=0 just before the input data.

Here, a linear primary expression is used as a polynomial approximate expression. The predicted value $S1_0$ of smoothing of data and the predicted value $B1_0$ of a slope of smoothed data are derived by Expressions (15) and (16), respectively.

Predicted value of smoothing of data: $S1_0=\{330Y1_1+275Y1_2+220Y1_3+165Y1_4+110Y1_5+55Y1_6+0Y1_7-55Y1_8-110Y1_9-165Y1_{10}\}/825$    Expression (15)

Predicted value of slope of smoothed data: $B1_0=\{-45Y1_1-35Y1_2-25Y1_3-15Y1_4-5Y1_5+5Y1_6+15Y1_7+25Y1_8+35Y1_9+45Y1_{10}\}/825$    Expression (16)

An initial value $S2_1$ of a predicted value of smoothing of data and an initial value $B2_1$ of a predicted value of a slope of smoothed data are set to satisfy $S2_1=S1_1$ and $B2_1=0$, respectively, in second double exponential smoothing processing illustrated in FIG. 2. The above initial value setting method has an effect that an error of initial input data is small after starting to input the data, and the data smoothing processing and the data differential processing can be performed with high precision.

Here, the polynomial approximate expression has derived the predicted value $S1_0$ of smoothing of data and the predicted value $B1_0$ of a slope of smoothed data that are pieces of virtual data at t=0 just before the input data. Each of the predicted values derived by the polynomial approximate expression at arbitrary time, such as t=1, may be used as each of the initial values. Note that, in this case, there is a disadvantage in terms of, for example, data smoothing processing and data differential processing with short time steps when compared to a case where the virtual data at t=0 is used.

As described above, the first double exponential smoothing processing is performed so as to acquire the predicted value $S1_t$ of smoothing of data of first output and the predicted value $B1_t$ of a slope of smoothed data of the first output. Next, a second double exponential smoothing processing is performed by using the following Expressions (17) and (18) with the predicted value $B1_t$ of a slope of smoothed data of the first output as second input data Y2t. Then, a predicted value S2t of smoothing of data of second output and a predicted value $B2_t$ of a slope of smoothed data of the second output, are acquired.

Smoothing of data: $S2_t=\alpha2 Y2_t+(1-\alpha2)(S2_{t-1}+B2_{t-1})$    Expression (17)

Slope of smoothed data: $B2_t=\gamma2(S2_t-S2_{t-1})+(1-\gamma2)B2_{t-1}$    Expression (18)

Data smoothing processing result data $S1_t$, data first order differential processing result data $S2_t$, and data second order differential processing result data $B2_t$, are output as collective or sequential data. Here, the smoothing parameter $\alpha2$ of smoothing of data and the smoothing parameter $\gamma2$ of the slope of smoothed of data in the second double exponential smoothing are previously set to be arbitrary constants. Note that $0<\alpha2<1$ and $0<\gamma2<1$ are satisfied. The predicted value $B1_t$ of a slope of smoothed data of the first output also corresponds to the first order differential processing result and may be used. However, a variation of the data result is large. Thus, the second double exponential smoothing processing performs data smoothing processing to the predicted value $B1_t$ of a slope of smoothed data.

The above type I adaptive double exponential smoothing method and a method for performing double exponential smoothing processing twice, can dramatically improve both an increase of an S/N ratio and shortening of delay time in each of, for example, the data smoothing processing result, the data first order differential processing result, and the data second order differential processing result. In a case where a change point of a system to be an object is detected based on a first differential data and a second differential data and an apparatus to be an object is controlled close to real time with further high precision, improvement of data processing performance, such as further shortening of time delay, improvement of responsiveness, and further a high S/N ratio together, is made. Thus, control accuracy of the apparatus to be an object can be improved.

Accordingly, in the first double exponential smoothing processing illustrated in FIG. 2, data processing is performed by using the following Expressions (19) to (24) in a case of type II according to the present embodiment.

Smoothing of data: $S1_t=\alpha1_t Y1_t+(1-\alpha1_t)(S1_{t-1}+B1_{t-1})$    Expression (19)

Slope of smoothed data: $B1_t=\alpha1_t(S1_t-S1_{t-1})+(1-\alpha1_t)B1_{t-1}$    Expression (20)

Smoothing coefficient: $\alpha 1_t = (K-L)F_t + L$    Expression (21)

Response coefficient: $F_t = 1 - \mathrm{Exp}[-\delta\alpha_t^2/(2\sigma_t^2)]$    Expression (22)

Relative error: $\delta\alpha_t = A1(Y_t - S1_t) + (1-A1)\delta\alpha_{t-1}$    Expression (23)

Predicted error variance: $\sigma_t^2 = A1(Y_t - S1_t)^2 + (1-A1)\sigma_{t-1}^2$    Expression (24)

where K, L, and A1 are arbitrary constants. Note that 1>K>L>0, and 1>A1>0 are satisfied. An initial value of at is calculated from standard deviation of an error between input data and a result of a polynomial approximation using initial several pieces of data, in the input data like the above initial value deriving method. The response coefficient $F_t$ is acquired by subtracting a probability density function (normal distribution function, Gaussian distribution function) from 1. Typically, the error sometimes becomes normal distribution. Accordingly, the response coefficient $F_t$ uses the probability density function representing normal distribution. Accordingly, the smoothing coefficient suitable for minimizing the error can be set in accordance with a data change.

Figure 3A:
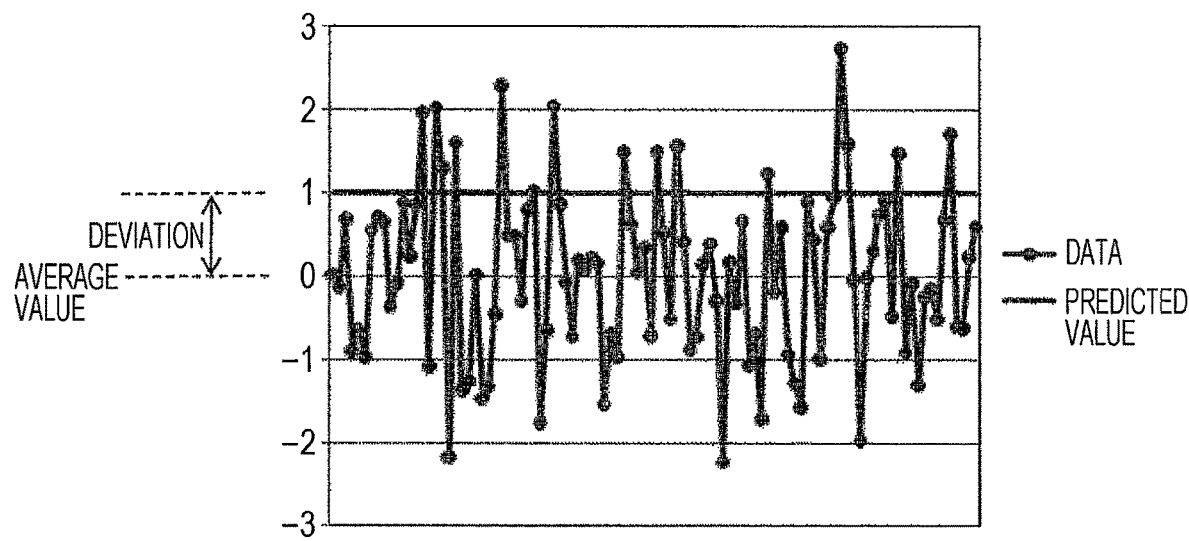
FIG. 3A is a graphical representation illustrating a definition of deviation of a predicted value from an average value in random number data.
Figure 3B:
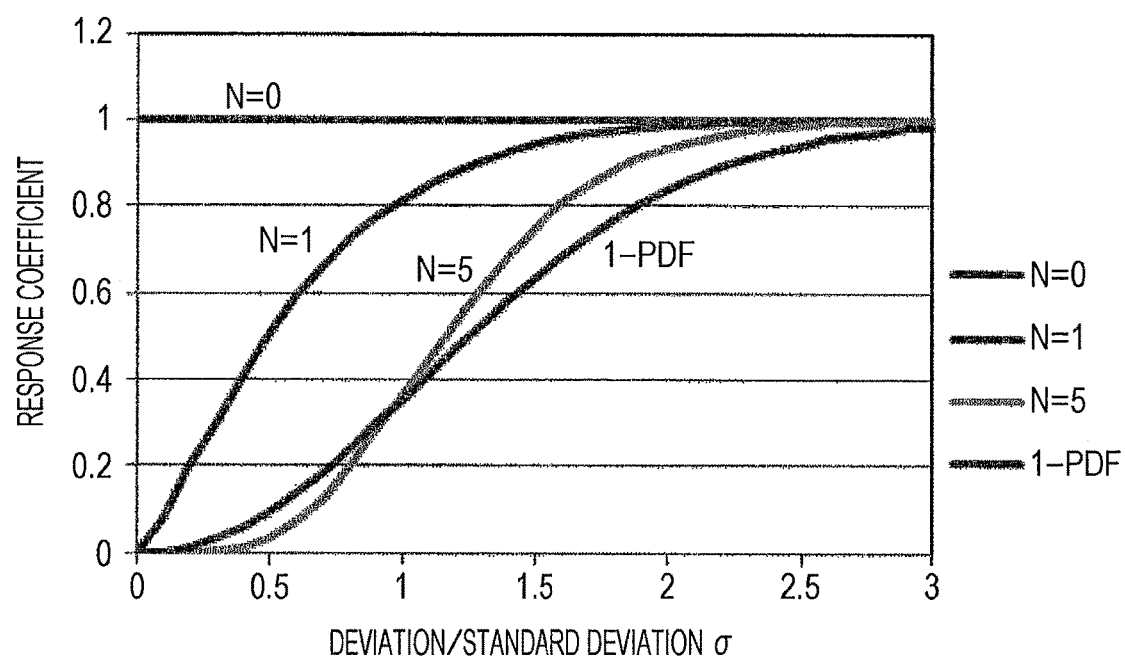
FIG. 3B is a graphical representation of a relationship between deviation/standard deviation σ and a response coefficient $F_t$ in the data in FIG. 3A.

As illustrated in FIG. 3A, for example, a value at which a predicted value easily occurs, and deviation from the average value are defined in random number data following normal distribution with an average of 0 and standard deviation $\sigma=1$. FIG. 3B is a relationship between the above deviation/the above standard deviation $\sigma$ and the response coefficient $F_t$. Here, graphs with N=0, N=1, and N=5 represent response coefficients in the type I adaptive double exponential smoothing method illustrated in Expressions (5) to (14). A graph with 1–PDF represents a response coefficient in a type II adaptive double exponential smoothing method using the probability density function in Expressions (19) to (24).

Here, PDF represents a probability density function. The graph with 1-PDF has a response coefficient characteristic similar to that of the graph with N=5. In a case where the deviation/the standard deviation $\sigma$<approximately 1 is satisfied, the response coefficient is larger than that of the graph with N=5. In a case where the deviation/the standard deviation $\sigma$>approximately 1 is satisfied, the response coefficient is smaller than that of the graph with N=5. According to the response characteristic, there is an effect that data smoothing processing and data differential processing can be performed with data smoothing performance (S/N ratio) and data responsiveness (shortening of delay time) compatible with each other.

In the above first double exponential smoothing processing, in a case of type III according to the present embodiment, data processing is performed by using the following Expressions (25) to (32).

Smoothing of data: $S1_t = \alpha 1_t Y1_t + (1-\alpha 1_t)(S1_{t-1} + B1_{t-1})$    Expression (25)

Slope of smoothed data: $B1_t = \alpha 1_t(S1_t - S1_{t-1}) + (1-\alpha 1_t)B1_{t-1}$    Expression (26)

Smoothing coefficient: $\alpha 1_t = (K-L)F_t + L$    Expression (27)

Response coefficient: $F_t = 1 - \mathrm{Exp}[-\delta\alpha_t^2/(2\sigma_t^2)]$    Expression (28)

Relative coefficient: $\delta\alpha_t = A1_t(Y1_t - S1_t) + (1-A1_t)\delta\alpha_{t-1}$    Expression (29)

Predicted error variance: $\sigma_t^2 = A1_t(Y1_t - S1_t)^2 + (1-A1_t)\sigma_{t-1}^2$    Expression (30)

Adaptive addition coefficient: $A1_t = \mathrm{MAX}(A1, \beta_t A1_{max})$    Expression (31)

Slope coefficient: $\beta_t = 1 - \mathrm{Exp}[-B_t^2/(2NN\,C)^2]$    Expression (32)

where $A1_{max}$ is an upper limit value of the addition coefficient (0<$A1_{max}$<1), and NN is a sensitivity coefficient and an arbitrary constant. Symbol C is a slope calculated from a result of a linear approximate expression using initial several pieces of data in input data like the above initial value deriving method. The type III is achieved by introducing the adaptive addition coefficient into the type II. Expressions (25) to (30) in the type III are similar to Expressions (19) to (24) in the type II. FIG. 4 is an example of a change of a slope of signal output to be an input. In this case, based on an initial slope C during a calculation period, a slope becomes large and then changes to the substantially same slope as the initial value, again.

According to the present embodiment, the addition coefficient is changed in accordance with the change of the slope. According to Expressions (29) and (30), the addition coefficient $A1_t$ corresponds to a coefficient of exponential weighted average processing. Therefore, the coefficient of exponential weighted average processing is changed in accordance with the initial slope C. In a case where a slope $B1_t$ of smoothing data increases compared to the initial slope C, the adaptive addition coefficient $A1_t$ is decreased and a ratio of a coefficient of the latest data is effectively increased so that responsiveness is improved. Regarding the adaptive addition coefficient $A1_t$, the slope coefficient $\beta_t$ is first calculated by Expression (32).

The slope coefficient $\beta_t$ is calculated by using a probability density function (normal distribution function, Gaussian distribution function) like the above response coefficient $F_t$. In Expression (31), the set value A1 is used as the adaptive addition coefficient $A1_t$ in a normal state. When the slope of smoothing data increases and $\beta_t A1_{max}$ becomes larger than the set value A1, the value of $\beta_t A1_{max}$ is used as an addition coefficient. Note that the upper limit value $A1_{max}$ can be set in order to inhibit the responsiveness from excessively improving.

In a case where the slope of smoothed data has become similar to the initial slope due to introduction of the adaptive addition coefficient $A1_t$, the addition coefficient remains so as to be the set value. In a case where the slope of smoothed data indicating a change of a data state becomes large, when the adaptive addition coefficient $A1_t$ is increased, specific gravity of the latest data becomes large. Thus, there is an effect that the responsiveness of data processing further improves.

In the above first double exponential smoothing processing, in a case of type IV according to the present embodiment, data processing is performed by using the following Expressions (33) to (42).

Smoothing of data: $S1_t = \alpha 1_t SGB0D_t + (1-\alpha 1_t)(S1_{t-1} + B1_{t-1})$    Expression (33)

Slope of smoothed data: $B1_t = \alpha 1_t SGB1D_t + (1-\alpha 1_t)B1_{t-1}$    Expression (34)

$SGB0D_t = (83Y1_t + 54Y1_{t-1} + 30Y1_{t-2} + 11Y1_{t-3} - 3Y1_{t-4} - 12Y1_{t-5} - 16Y1_{t-6} - 15Y1_{t-7} - 9Y1_{t-8} + 2Y1_{t-9} + 18Y1_{t-10})/143$    Expression (35)

$SGB1D_t = (945S1_t + 456S1_{t-1} + 67S1_{t-2} - 222S1_{t-3} - 411S1_{t-4} - 500S1_{t-5} - 489S1_{t-6} - 378S1_{t-7} - 167S1_{t-8} + 144S1_{t-9} + 555S1_{t-10})/4290$    Expression (36)

Smoothing coefficient: $\alpha 1_t = (K-L)F_t + L$    Expression (37)

Response coefficient: $F_t=1-\text{Exp}[-\delta\alpha_t^2/(2\sigma_t^2)]$  Expression (38)

Relative error: $\delta\alpha_t=A1_t(Y_t-S1_t)+(1-A1_t)\delta\alpha_{t-1}$  Expression (39)

Predicted error variance: $\sigma_t^2=A1_t(Y_t-S1_t)^2+(1-A1_t)\sigma_{t-1}^2$  Expression (40)

Adaptive addition coefficient: $A1_t=\text{MAX}(A1, \beta_t A1_{max})$  Expression (41)

Slope coefficient: $\beta_t=1-\text{Exp}[-B_t^2/(2\ NN\ C)^2]$  Expression (42)

Here, by a backward Savitzky-Golay method described in James W Taylor, Journal of Forecasting, 2004, (23), pp 385-394, $SGB0D_t$ uses input data $Y1_t$ to $Y1_{t-10}$ including successive eleven terms, and is a data smoothing processing result at a point in time of the latest data $Y1_t$. Similarly, by the backward Savitzky-Golay method, $SGB1D_t$ uses predicted values $S1_t$ to $S1_{t-10}$ of smoothing of data including successive eleven terms, and is a first order differential processing result at a point in time of a predicted value $S1_t$ of smoothing of the latest data. Note that, James W Taylor, Journal of Forecasting, 2004, (23), pp 385-394 may partially include an error. Therefore, the error has been corrected so as to be used.

Expressions (33), (34), (37) to (42) are substantially the same as Expressions (25) to (32) in the above type III. Expressions (5) and (6) that are basic parts of the double exponential smoothing method and the type I adaptive double exponential smoothing method, mean the following Expressions (43) and (44), respectively.

Smoothing of data: $S1_t=\alpha1_t(\text{input data})_t+(1-\alpha1_t)$
$(S1_{t-1}+B1_{t-1})$  Expression (43)

Slope of smoothed data: $B1_t=\gamma1_t(\text{slope of a predicted value of smoothing of data})_t+(1-\gamma1_t)B1_{t-1}$  Expression (44)

In the type IV, a result to which data smoothing processing has been performed by using the backward Savitzky-Golay method, is used as pre-processing instead of input data in Expression (43). A result to which a first order differential processing has been performed by using the backward Savitzky-Golay method, is used as pre-processing instead of the slope of a predicted value of smoothed data in Expression (44). Typically, a polynomial fitting method (Savitzky-Golay method) sometimes uses a series of a plurality of pieces of data so as to derive a data processing result at the center point of a period of the series of the plurality of pieces of data. Here, this is defined as a center Savitzky-Golay method. In contrast, a case where a data processing result at a point in time of the latest data is derived, is defined as the backward Savitzky-Golay method.

In a case of the center Savitzky-Golay method, the data processing result is derived at the center point of a series of data. Therefore, occurrence of delay time cannot be avoided in the data processing. In a Savitzky-Golay method, as the number of data to be used increases, an S/N ratio improves. In the center method, as the number of data to be used increases, the delay time increases. In a case of the backward Savitzky-Golay method, since the data processing result is derived at a point in time of the latest data, a delay of the data processing hardly occurs. However, the backward method decreases an S/N ratio when compared to the center method.

As the examination, when a case of the center method including five pieces of data and a case of the backward method including eleven pieces of data are compared to each other, it has been found that substantially the same S/N ratios can be acquired. The Savitzky-Golay method uses a plurality of pieces of data so as to perform a polynomial approximation to a quadratic curve or a cubic curve. Thus, when the number of data increases, the Savitzky-Golay method cannot be applied to a change of a cubic or more during a period during which the number of the data has been used. That is, when the number of data to be used increases, a risk that a radio frequency component is lost, occurs.

In consideration of the above problems, in the type IV, data smoothing processing of the backward Savitzky-Golay method including eleven pieces of data is used for the input data in Expression (33). A data first order differential processing value of the backward Savitzky-Golay method including eleven pieces of data, is used for the slope of a predicted value of smoothing of data in Expression (34). Accordingly, according to the present embodiment, there is an effect that S/N ratios of data smoothing processing and data differential processing improve without increasing data delay time and with inhibiting degradation of a frequency characteristic of the data processing as small as possible. In the type IV, the backward Savitzky-Golay method including eleven pieces of data has been used. The number of data may be changed in accordance with data processing performance to be required. Alternatively, a Savitzky-Golay method in which data processing is performed at a point in time, for example, between the center method and the backward method, may be used.

Furthermore, as pre-processing other than the Savitzky-Golay method, a result in which data smoothing processing has been performed to input data, may be used for the input data in Expression (43). A result in which data first order differential processing has been performed to a predicted value of smoothing of data, may be used for the slope of a predicted value of smoothing of data in Expression (44).

Figure 5:
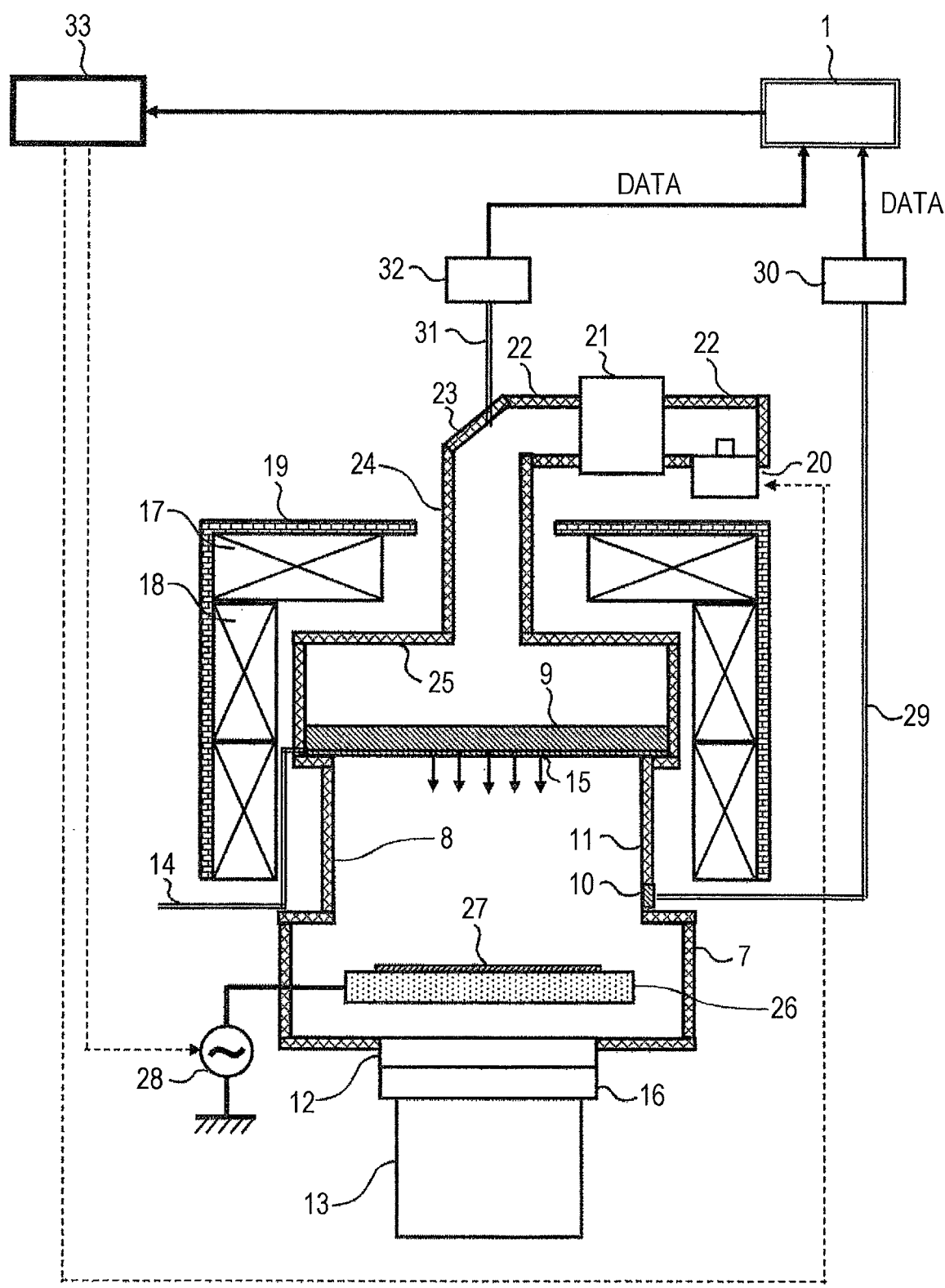
FIG. 5 is a longitudinal sectional view of a microwave plasma etching apparatus with magnetic field according to the first embodiment.

FIG. 5 is a longitudinal sectional view of a microwave plasma etching apparatus with magnetic field according to the first embodiment of the present invention. According to the present embodiment, the microwave plasma etching apparatus with magnetic field corresponds to the system 6 to be an object (for example, apparatus and analytical data) in FIG. 1. An on-off valve 12 for exhaust is opened so that an evacuation device 13 depressurizes the inside of a processing chamber 11 divided into a container 7, a discharge tube 8, a quartz plate 9, and a quartz window 10. Etching gas flows in a piece of gas piping 14 through a mass flow controller (not illustrated) and passes through between the quartz plate 9 and a quartz shower plate 15. Then, the etching gas is introduced from a gas hole of the quartz shower plate 15 into the processing chamber 11. An exhaust speed variable valve 16 adjusts pressure inside the processing chamber 11 including the etching gas introduced thereto, to predetermined pressure.

The processing chamber 11 is arranged in a region in which coils 17 and 18 and a yoke 19 generate a magnetic field. A microwave having a frequency of 2.45 GHz oscillated by a magnetron 20 propagates, in a rectangular TE10 mode, into a rectangular waveguide 22 through an isolator (not illustrated), a power monitor (not illustrated), and a matching unit 21. Then, the microwave propagates, in a circular TE11 mode, into a circular waveguide 24 through a circle/rectangle converter 23. After that, the microwave is introduced to a cavity resonator 25 and passes through the quartz plate 9 and the quartz shower plate 15 so as to enter into the processing chamber 11. A magnetic field region with a magnetic flux density of 875 Gauss causes electron cyclotron resonance, together with the microwave having a frequency of 2.45 GHz to be introduced. Inside the processing chamber 11, the magnetic field region is formed perpendicular to both the center axis of the processing chamber 11 and a direction in which the microwave is introduced. In addition, the magnetic field region is formed on an entire surface in a cross-sectional direction with respect to the center axis of the processing chamber 11.

Etching processing is performed to a wafer 27 disposed on a wafer disposing electrode 26 that is a sample stage, by using plasma mainly generated by interaction between the microwave having a frequency of 2.45 GHz and a magnetic field having a magnetic flux density of 875 Gauss. In order to control an etching shape of the wafer 27 that is a sample, the wafer disposing electrode 26 is coupled to a radio frequency power source 28 through a matching unit (not illustrated) so that a radio frequency voltage can be applied. A chiller unit (not illustrated) is coupled to the wafer disposing electrode 26 so that a temperature of the wafer 27 can be controlled.

Each of the processing chamber 11, the wafer 27, and the wafer disposing electrode 26 is coaxially disposed. Each of a gas hole region of the quartz shower plate 15 introducing the etching gas, the on-off valve 12 for exhaust that is an evacuation unit, the exhaust speed variable valve 16, and the evacuation device 13 is also coaxially disposed with respect to the processing chamber 11. Accordingly, a gas flow is coaxially symmetric on the wafer 27. The coils 17 and 18 and the yoke 19 that generate a magnetic field are also coaxially disposed with respect to the processing chamber 11. Thus, a magnetic field profile and an electron cyclotron resonance region having a magnetic flux density of 875 Gauss in the processing chamber 11 are coaxially formed with respect to the processing chamber 11. The circular waveguide 24 and the cavity resonator 25 are also coaxially disposed with respect to the processing chamber 11. Thus, the microwave to be introduced into the processing chamber 11 is also coaxially introduced with respect to the processing chamber 11.

The magnetic field is coaxially generated with respect to the processing chamber 11 and the microwave is also coaxially introduced with respect to the processing chamber 11. Thus, the plasma formed by the interaction between the magnetic field and the microwave, is coaxially generated with respect to the processing chamber 11. Accordingly, electrons and ions in the plasma are coaxially transported with respect to the wafer 27. A flow of the etching gas is also coaxial with respect to the processing chamber 11. Thus, radicals generated by the plasma and a reaction product due to etching of the wafer 27 are also coaxially introduced and discharged with respect to the wafer 27. Therefore, etching processing can be performed with uniform etching process processing performance, such as an etching rate, a material selection ratio, and an etching shape, in a surface of the wafer.

Light emission, from the side of the processing chamber 11, from the plasma generated in the processing chamber 11, passes through the quartz window 10 and an optical fiber 29. Then, the light emission is introduced into a spectroscope 30 so as to be output as time series data of wavelength dependency of light intensity. Light emission from the plasma from an upper part of the processing chamber 11 passes through the quartz shower plate 15, the quartz plate 9, the cavity resonator 25, the circular waveguide 24, the circle/rectangle converter 23, and an optical fiber 31. Then, the plasma light emission is introduced into a spectroscope 32 so as to be output as time series data of wavelength dependency of light intensity.

The etching gas and the etching reaction product from the wafer 27 are introduced into the processing chamber 11. The interaction between the microwave and the magnetic field separates these so as to generate the plasma. Accordingly, light emission from the plasma generated in the processing chamber 11 includes information on atoms, molecules, radicals included in the etching gas and the etching reaction product, and reactants of the atoms, the molecules, and the radicals.

For example, a typical poly-Si etching using an Si substrate on which a poly-Si film and an $SiO_2$ film are disposed below a pattern mask, is required to perform Poly-Si etching with a high selection ratio with respect to the lower layer $SiO_2$. A halogen based gas is used for the etching gas. The etching reaction product includes Si that is a material to be etched, and a halogen. Since the etching reaction product is re-separated by the plasma, the spectroscope 30 or the spectroscope 32 monitors light intensity of light emission having a wavelength of 288 nm resulting from the Si, from the plasma.

In this case, in a case where the etching of the poly-Si film has been completed and the lower layer $SiO_2$ appears, since an etching rate of the lower layer $SiO_2$ is small, the plasma light emission intensity with a wavelength of 288 nm resulting from the Si dramatically decreases and then comes close to a constant value. A change of the plasma light emission is monitored so that an end point of the etching processing is detected.

The light emission of the plasma from the side of the processing chamber 11 includes information on the etching gas and the etching reaction product. Meanwhile, the light emission of the plasma from the upper part of the processing chamber 11 includes, in addition to the above information, information on a film structure and a step structure of the wafer 27 since the plasma light causes interference due to the film structure and the step structure of the wafer 27. Analyzing the light emission data of the plasma can monitor the thickness of the film and the depth of etching during the etching. According to the present embodiment, for simplicity, light emission data of the plasma from the side of the processing chamber 11 is used for monitoring an etching end point.

FIGS. 6A to 6D illustrate a series of graphical representations of a typical data processing flow for detecting the etching end point. Input data $Y1_t$ is formed by an evaluation function in Expression (45) that simulates a change of plasma light emission intensity during etching.

$$Y1_t = H/[1+\exp\{-A(t-T)\}]+Ct+D+F(R-0.5) \quad \text{Expression (45)}$$

where H, A, T, C, D, and F are arbitrary constants, and R is a random number between 0 and 1. Since analytical true values of the data smoothing processing, the first order differential processing, the second order differential processing, have been known, using the above evaluation function can compare and evaluate data processing performance, such as an absolute error, delay time in accordance with data processing, an S/N ratio (signal/noise ratio), with respect to the true values in various data processing methods.

Figure 6A:
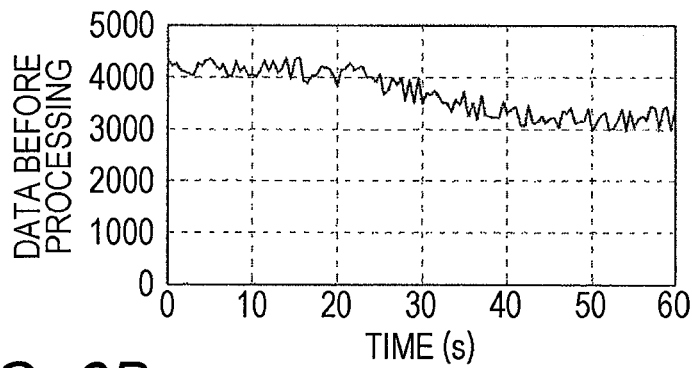
FIGS. 6A to 6D illustrate a series of graphical representations of typical data processing for detecting an etching end point.
Figure 6B:
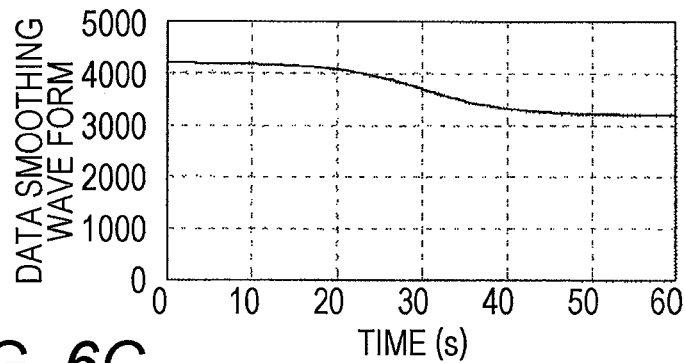
Figure 6C:
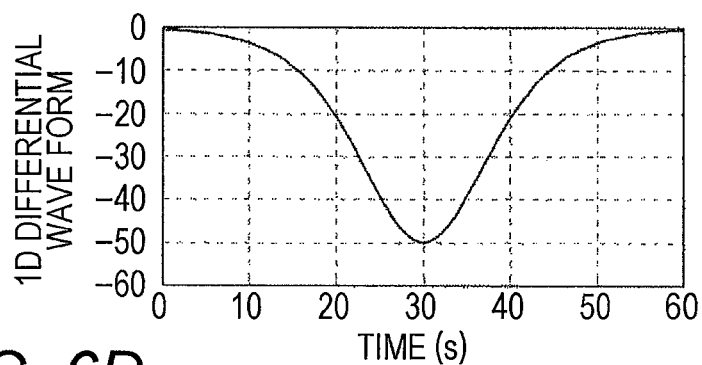
Figure 6D:
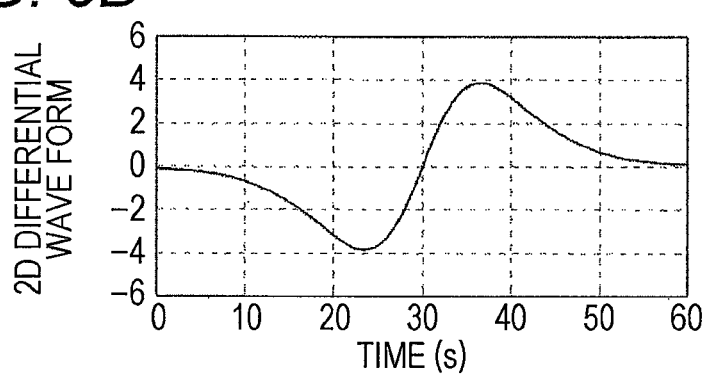

In the typical data processing flow for detecting the etching end point illustrated in FIGS. 6A to 6D, data smoothing processing is performed to an input data wave form illustrated in FIG. 6A for acquiring an input data wave form illustrated in FIG. 6B. After that, a first order differential processing and a second differential processing are performed for acquiring a wave form illustrated in FIG. 6C and a wave form illustrated in FIG. 6D, respectively. Performing the data smoothing processing to the input data including much noise makes a change point clear. The first order differential processing detects the change point as a point (time) of a peak value. The second order differential processing detects the change point as a zero cross point (time). The etching end point is determined based on the zero cross point (time) so that the etching apparatus is controlled and etching processing with high precision is performed.

The change point can be further clearly and simply determined from sequentially the peak of the first differential processing and the zero cross of the second differential processing. However, an absolute value of signal intensity sequentially decreases. Accordingly, data processing with a high S/N ratio is important. In particular, in a case where a mask pattern having a small area to be etched, with a low aperture ratio, is etched, a change of the plasma light emission intensity is small before and after the etching end point. Thus, data processing with a further high S/N ratio is required.

Typically, in data smoothing processing and data differential processing, as an S/N ratio increases, delay time lengthens. Thus, an absolute value increases with respect to a true value. That is, there is a trade-off relationship between the S/N ratio and the delay time, the absolute value. Data smoothing processing and data differential processing for simultaneously satisfying the S/N ratio, the delay time, and the absolute value, are required.

According to the present embodiment, data processing in FIG. 6 is performed by using the flow including the data smoothing processing and the data differential processing illustrated in FIG. 2. The input data in FIG. 6 corresponds to output data from the spectroscope 30 for monitoring the plasma light emission during the etching in the microwave plasma etching apparatus with magnetic field in FIG. 5. As illustrated in FIG. 5, a system control apparatus 33 for controlling the microwave plasma etching apparatus with magnetic field as a system (including, for example, data input/output apparatus, data processing apparatus, and data display apparatus) and the data processing apparatus 1 according to the present embodiment, are disposed. The data processing apparatus 1 may be built in as a part of the system control apparatus 33.

Pieces of output data from the spectroscope 30 and the spectroscope 32 are transmitted to the data processing apparatus 1. A data smoothing processing result, a data first order differential result, and a data second order differential result are transmitted to the system control apparatus 33 that is a control apparatus. Based on the data smoothing processing result, the data first order differential result, and the second order differential result, the system control apparatus 33 determines the etching end point so as to control the microwave plasma etching apparatus with magnetic field as a system. Plasma production is mainly controlled in the determination of the etching end point. In FIG. 5, pieces of coupling of the system control apparatus 33 to the magnetron 20 and the radio frequency power source 28 are illustrated. The system control apparatus 33 is also coupled to other apparatuses, not illustrated in FIG. 5, included in the system.

FIGS. 7A to 7D are data processing results in a case where the type IV adaptive double exponential smoothing method including Expression (33) to (42) is used with the data processing flow in FIG. 2 in the data processing apparatus 1 according to an embodiment of the present invention. FIGS. 8A to 8D are data processing results in a case where N=0 is satisfied in the type I adaptive double exponential smoothing method including Expression (5) to (14). FIGS. 9A to 9D are data processing results in a case where N=1 is satisfied in the same method as in FIGS. 8A to 8D. FIGS. 10A to 10D are data processing results in case where N=5 is satisfied in the same method as in FIGS. 8A to 8D.

In FIGS. 7A to 7D, FIGS. 8A to 8D, FIGS. 9A to 9D, and FIGS. 10A to 10D, each of As illustrates input data ($Y1_t$) and a data smoothing processing result ($S1_t$). Each of Bs illustrates a first differential processing result ($B1_t$). Each of Cs illustrates a first order differential smoothing processing result ($S2_t$). Each of Ds illustrates a second order differential processing result ($B2_t$). The same input data is used in cases of FIGS. 7A to 10A.

FIGS. 7A to 7D, FIGS. 8A to 8D, FIGS. 9A to 9D, and FIGS. 10A to 10D are compared to each other. First, regarding the data smoothing processing of As, it can be found that the data smoothing processing result in FIG. 7A according to a type IV embodiment of the present invention follows a change of the input data and includes less overshoot, excellent responsiveness, and small errors when compared to results in FIGS. 8A, 9A, and 10A of the type I. Next, regarding the first order differential smoothing processing of Cs, a result in FIG. 7C according to the type IV embodiment of the present invention illustrates that first order differential peak time is faster and a full width at half maximum of a wave form is smaller when compared to results in FIGS. 8C, 9C, and 10C of the type I. Accordingly, it can be found that delay time of the data processing is small and responsiveness is excellent.

Figure 7A:
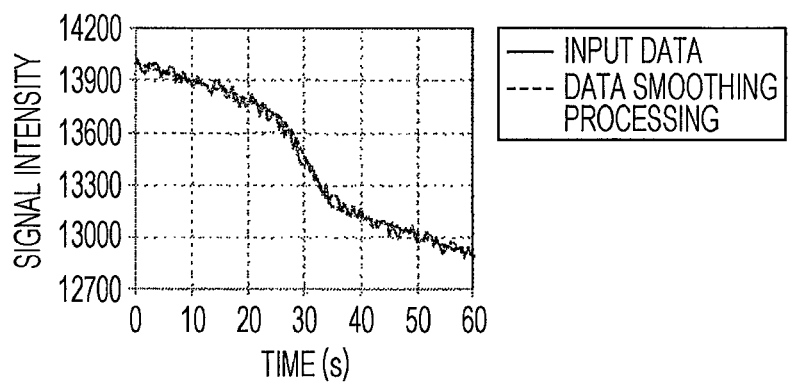
FIGS. 7A to 7D illustrate data processing results of an adaptive double exponential smoothing method (type IV) including Expressions (33) to (42) by using the data processing flow illustrated in FIG. 2 in the data processing apparatus according to the first embodiment.
Figure 7B:
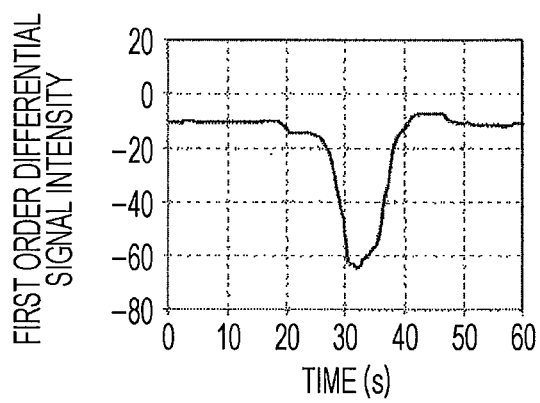
Figure 7C:
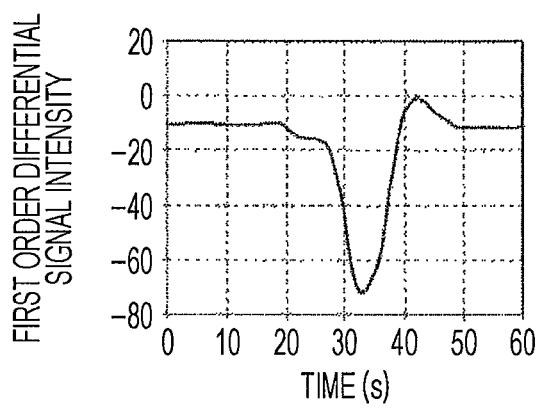
Figure 7D:
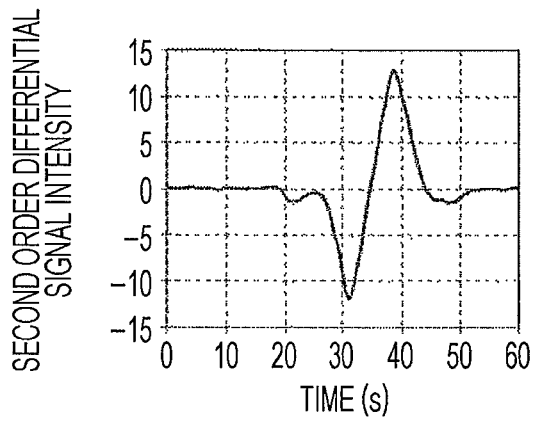
Figure 8A:
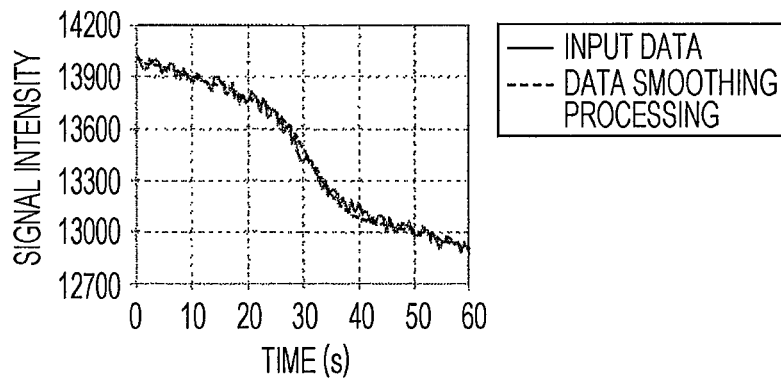
FIGS. 8A to 8D illustrate data processing results of an adaptive double exponential smoothing method (type I) including Expressions (5) to (14) in a case of N=0.
Figure 8B:
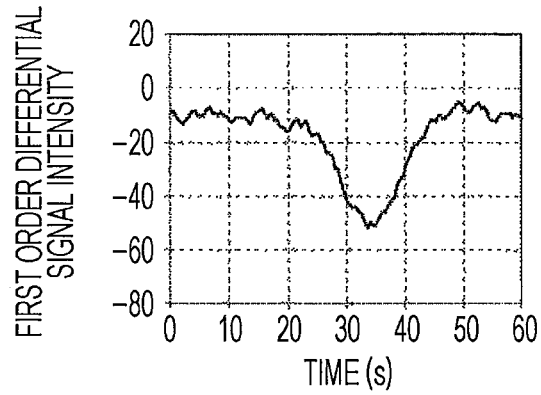
Figure 8C:
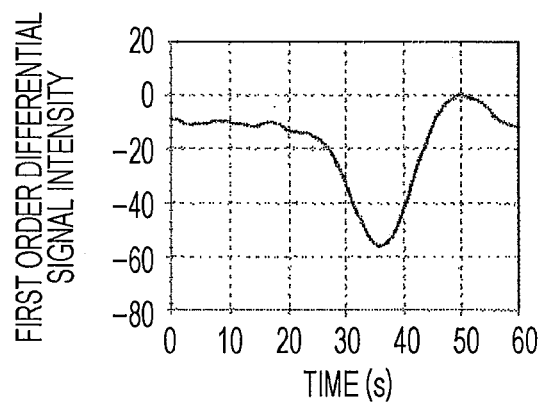
Figure 8D:
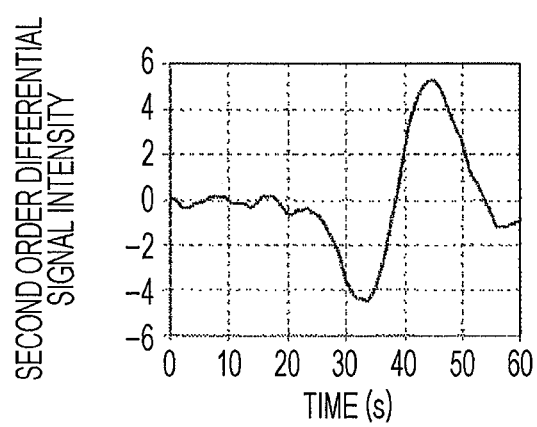
Figure 9A:
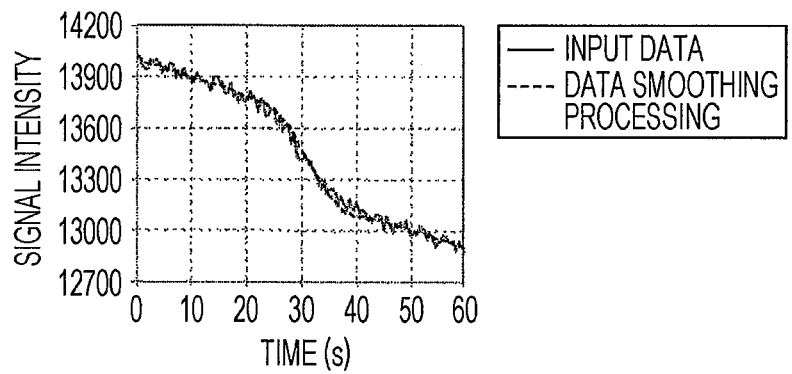
FIGS. 9A to 9D illustrate data processing results of the adaptive double exponential smoothing method (type I) including Expression (5) to (14) in a case of N=1.
Figure 9B:
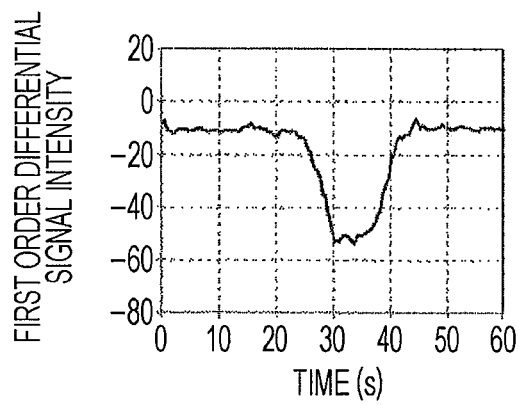
Figure 9C:
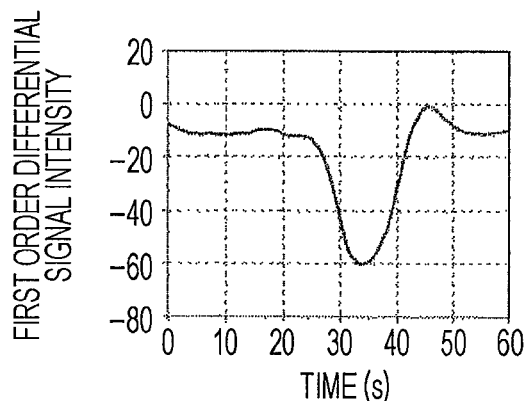
Figure 9D:
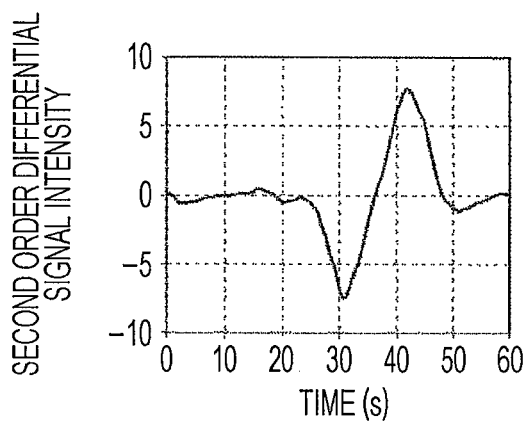
Figure 10A:
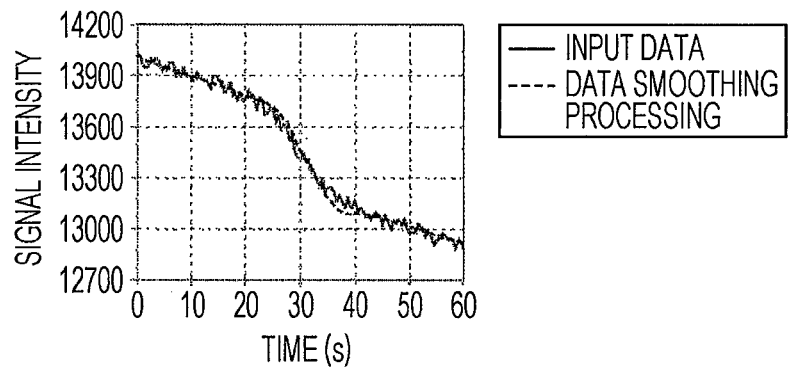
FIGS. 10A to 10D illustrate data processing results of the adaptive double exponential smoothing method (type I) including Expression (5) to (14) in a case of N=5.
Figure 10B:
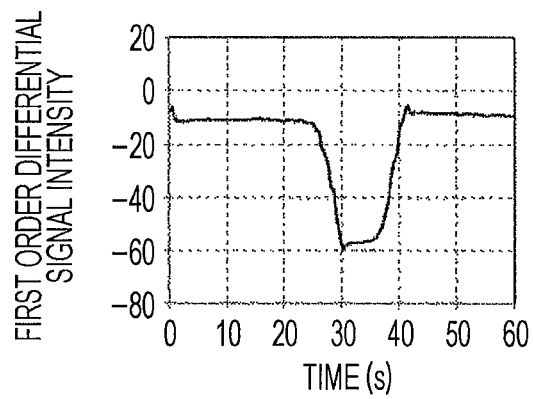
Figure 10C:
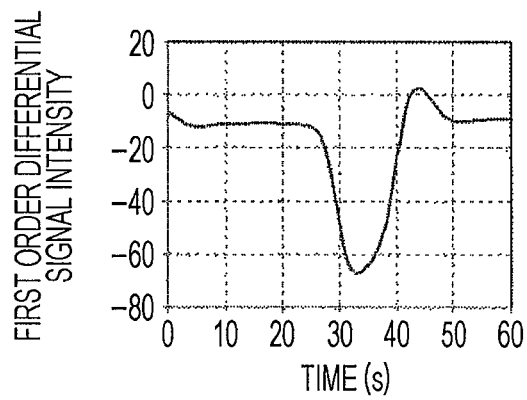
Figure 10D:
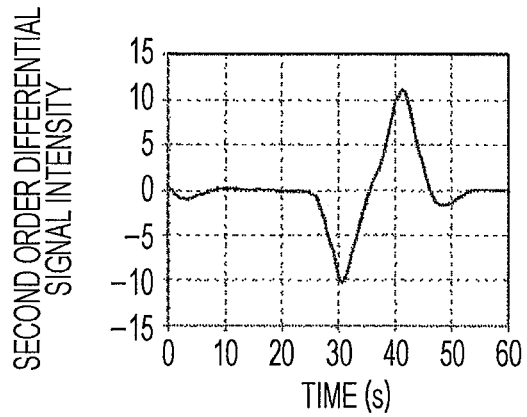

Regarding the second order differential processing of Ds, a result in FIG. 7D according to the type IV embodiment of the present invention illustrates that second order differential zero cross time is faster and an entire width of a second order differential wave form is smaller when compared to results in FIGS. 8D, 9D, and 10D of the type I. Furthermore, the wave form is smooth and second order differential signal intensity is large. Accordingly, it can be found that delay time of the data processing is small and responsiveness and an S/N ratio are excellent. In comparison of numerical values, the S/N ratios of the second order differential wave forms in FIG. 7D according to the type IV embodiment of the present invention, FIG. 8D of the type I (N=0), FIG. 9D of the type I (N=1), and FIG. 10D of the type I (N=5) are 1862, 68, 621, and 957, respectively.

Delay time at the second order differential wave form zero cross time in FIG. 7D according to the embodiment of the present invention is faster and shortened than that in FIG. 8D of the type I (N=0) by 3.9 seconds, that in FIG. 9D of the type I (N=1) by 1.6 seconds, and that in FIG. 10D of the type I (N=5) by 0.9 seconds. Accordingly, according to the embodiment of the present embodiment, performance of the delay time and performance of the S/N ratio have been improved when compared to the type I. Thus, there is an effect that shortening of the delay time (responsiveness improvement) and improvement of the S/N ratio are compatible with each other.

Therefore, it can be found that the first order differential peak point (time) and the second order differential zero cross point (time) to be reference for determining an etching end point can be clearly detected. Accordingly, according to the embodiment of the present invention, there is an effect that the data smoothing processing and the data differential processing can be sequentially performed in real time with the small absolute value error, the high S/N ratio, and the short delay time.

Regarding the first order differential processing of Bs, a result in FIG. 7B according to the type IV embodiment of the present invention is smoother than those in FIGS. 8B, 9B, and 10B of the type I. This is due to a pre-processing effect by the backward Savitzky-Golay method. Accordingly, in the processing flow in FIG. 2, since pieces of first output data (S1$_t$) and (B1$_t$) to be pieces of second input data, are smooth wave forms, a smoothing coefficient in second double exponential smoothing can be increased. Accordingly, pieces of delay time of a first order differential smoothing result (S$^{2t}$) and a second order differential processing result (B2$_t$) that are pieces of second output, can be shortened. Thus, responsiveness can be improved.

In a case where only the data smoothing processing result and the data first order differential result are required, according to the present embodiment, the first double exponential smoothing processing acquires a first order differential smooth wave form due to the pre-processing effect by the backward Savitzky-Golay method. Thus, the pieces of first output data (S1$_t$) and (B1$_t$) may be used without performing the second double exponential smoothing processing. In this case, there is an effect that a data processing program becomes simple and data processing speed is improved.

Type V is defined as a case where the backward Savitzky-Golay method is applied to the type I adaptive double exponential smoothing method illustrated in Expressions (5) to (14). The type V is illustrated by the following Expressions (46) to (57).

Smoothing of data: $S1_t = \alpha 1_t SGB0D_t + (1-\alpha 1_t)(S1_{t-1} + B1_{t-1})$  Expression (46)

Slope of smoothed data: $B1_t = \gamma 1_t SGB1D_t + (1-\gamma 1_t) B1_{t-1}$  Expression (47)

$SGB0D_t = (83 Y1_t + 54 Y1_{t-1} + 30 Y1_{t-2} + 11 Y1_{t-3} - 3 Y1_{t-4} - 12 Y1_{t-5} - 16 Y1_{t-6} - 15 Y1_{t-7} - 9 Y1_{t-8} + 2 Y1_{t-9} + 18 Y1_{t-10})/143$  Expression (48)

$SGB1D_t = (945 S1_t + 456 S1_{t-1} + 67 S1_{t-2} - 222 S1_{t-3} - 411 S1_{t-4} - 500 S1_{t-5} - 489 S1_{t-6} - 378 S1_{t-7} - 167 S1_{t-8} + 144 S1_{t-9} + 555 S1_{t-10})/4290$  Expression (49)

Smoothing coefficient: $\alpha 1_t = (K_\alpha - L_\alpha) F_\alpha + L_\alpha$  Expression (50)

Response coefficient: $F_{\alpha t} = (|\delta \alpha_t / \Delta \alpha_t| + \varphi)^N$  Expression (51)

Relative error: $\delta \alpha t = A1(Y1_t - S1_t) + (1-A1)\delta \alpha_{t-1}$  Expression (52)

Absolute error: $\Delta \alpha_t = A1|Y1_t - S1_t| + (1-A1)\Delta \alpha_{t-1} + \varphi$  Expression (53)

Smoothing coefficient: $\gamma 1_t = (K_\gamma - L_\gamma) F_\gamma + L_\gamma$  Expression (54)

Response coefficient: $F_\gamma = (|\delta \gamma_t / \Delta \gamma_t| + \varphi)^N$  Expression (55)

Relative error: $\delta \gamma_t = A2\{(S1_t - S1_{t-1}) - B1_t\} + (1-A2)\delta \gamma_{t-1}$  Expression (56)

Absolute error: $\Delta \gamma_t = A2|(S1_t - S1_{t-1}) - B1_t| + (1-A2)\Delta \gamma_{t-1} + \varphi$  Expression (57)

Responsiveness of the type V is worse than that of the type IV. However, there is an effect that a data processing program becomes simple. A form may be selected with a level and complexity necessary in accordance with performance of data processing to be required.

Furthermore, type VI is defined as a case where the backward Savitzky-Golay method is applied to the type II adaptive double exponential smoothing method illustrated in Expressions (19) to (24). The type VI is illustrated by the following Expression (58) to (65).

Smoothing of data: $S1_t = \alpha 1_t SGB0D_t + (1-\alpha 1_t)(S1_{t-1} + B1_{t-1})$  Expression (58)

Slope of smoothed data: $B1_t = \alpha 1_t SGB1D_t + (1-\alpha 1_t) B1_{t-1}$  Expression (59)

$SGB0D_t = (83 Y1_t + 54 Y1_{t-1} + 30 Y1_{t-2} + 11 Y1_{t-3} - 3 Y1_{t-4} - 12 Y1_{t-5} - 16 Y1_{t-6} - 15 Y1_{t-7} - 9 Y1_{t-8} + 2 Y1_{t-9} + 18 Y1_{t-10})/143$  Expression (60)

$SGB1D_t = (945 S1_t + 456 S1_{t-1} + 67 S1_{t-2} - 222 S1_{t-3} - 411 S1_{t-4} - 500 S1_{t-5} - 489 S1_{t-6} - 378 S1_{t-7} - 167 S1_{t-8} + 144 S1_{t-9} + 555 S1_{t-10})/4290$  Expression (61)

Smoothing coefficient: $\alpha 1_t = (K-L) F_t + L$  Expression (62)

Response coefficient: $F_t = 1 - \text{Exp}[-\delta \sigma_t^2 / (2\sigma_t^2)]$  Expression (63)

Relative error: $\delta \alpha_t = A1(Y1_t - S1_t) + (1-A1)\delta \alpha_{t-1}$  Expression (64)

Predicted error variance: $\sigma_t^2 = A1(Y1_t - S1_t)^2 + (1-A1)\sigma_{t-1}^2$  Expression (65)

Responsiveness of the type VI is also worse than that of the type IV. However, there is an effect that a data processing program becomes simple. In a case where N=0 is satisfied in the type V, a form in which the backward Savitzky-Golay method has been applied to the double exponential smoothing method with a fixed smoothing coefficient, is acquired. Thus, the simplest form is made. A form may be selected with a level and complexity necessary in accordance with performance of data processing to be required.

The type II is made by introducing a data adaptive smoothing coefficient using a probability density function into the type I adaptive double exponential smoothing method. The type III is made by introducing a data adaptive addition coefficient into the type II. The type IV is made by introducing pre-processing of the backward Savitzky-Golay method into the type III. Like the type V, the data adaptive smoothing coefficient using the probability density function and the data adaptive addition coefficient that are improvement elements in the type II and the type III, respectively, may be individually applied to the type I adaptive double exponential smoothing method. The data adaptive smoothing coefficient using the probability density function, the data adaptive smoothing coefficient, and the backward Savitzky-Golay method may be appropriately combined and may be applied to the type I adaptive double exponential smoothing method. Similarly as described above, a form may be selected with a level and complexity necessary in accordance with performance of data processing to be required.

Second Embodiment

As described above, in the data smoothing processing and the data differential processing, there is a trade-off relationship between the S/N ratio performance improvement and the data responding performance improvement (shortening of delay time). Accordingly, in the above type I adaptive double exponential smoothing method, or the data smoothing processing methods and the data differential processing methods of, for example, the type II, the type III, the type IV, the type V, and the type VI described in the first embodiment, a parameter for each of the data processing methods is required to be optimized in accordance with input data to which data processing is performed.

In the related art, a parameter of data processing is sequentially changed so that the data processing is performed. Each of data smoothing wave form, data differential wave form, and numerical data, such as an S/N ratio and delay time, are collectively overlooked so as to find an optimum parameter. However, the above method takes a long time to find the optimum parameter. For example, there is a problem that, for example, knowledge and experience of data processing are required in order to shorten the time taken for finding the optimum parameter.

James W Taylor, Journal of Forecasting, 2004, (23), pp 385-394 discloses the method for estimating an optimum smoothing parameter by minimizing a total sum of errors of a one-period predicted value by the simple exponential smoothing method. However, this method does not take smoothness of a curve of the predicted values into consideration. Thus, there is a problem that noise is large and an S/N ratio is not excellent in first order differential processing and second order differential processing that detect a change point.

Therefore, a method for simply and automatically, in a short time, finding an optimum parameter necessary for performing data smoothing processing and data differential processing to input data, will be described.

First, an evaluation function W in the following Expression (66) is used.

Evaluation function $W$=mean square error $E$+coefficient $\lambda$×second order differential mean square $D$ Expression (66)

Here, E that is the mean square error is a mean square error of the input data and a data smoothing processing result, and evaluates fitness of the data smoothing processing result with respect to the input data. D that is the second order differential mean square, evaluates curve smoothness of data smoothing processing wave form. The coefficient X is an arbitrary numerical value, and adjusts a ratio of importance between the above fitness evaluation with respect to the input data and the above curve smoothness evaluation.

As the fitness of the data smoothing processing result with respect to the input data increases, for example, no overshoot occurs. In addition, responsiveness of the data processing is excellent and delay time of the data processing is small. As a curve of the data smoothing processing wave form is smooth, each of a data first order differential processing wave form and a data second order differential wave form becomes a smooth curve. As a result, an S/N ratio of the data first differential processing and an S/N ratio of the data second order differential process improve. The curve smoothness is evaluated by the second order differential mean square D of the data smoothing processing wave form. However, here, a second order differential is calculated by a difference method.

As the second order differential mean square D comes close to a straight line, the value of the second order differential mean square D decreases. Therefore, in a case where not only the second order differential mean square D is simply small but also a value of the mean square error E is small and the fitness of the data smoothing processing result with respect to the input data is excellent, compatible with each other, the optimum processing has been performed with an excellent S/N ratio and excellent responsiveness of the data processing (delay time is small). The evaluation function W used in the present embodiment will be illustrated by the following Expression (67).

$W=\Sigma(Y1_t-S1_t)^2/N+\lambda\times\Sigma\{(S1_{t+1}-2\times S1_t+S1_{t+1})/\Delta T^2\}^2/N$ Expression (67)

where N is the number of data, and ΔT is sampling time (time interval) of the input data. The optimum parameter for each of the data smoothing processing and the data differential processing is derived by using a gradient method, such as a steepest descent method, so that the evaluation function W becomes a minimum value. In order to illustrate a characteristic of the evaluation function W in a two-dimensional graph, an example of the simple type I adaptive double exponential smoothing method will be described using FIGS. 11 to 13. Note that, the input data is similar to the input data used in FIGS. 7 to 10. However, the input data different from the input data used in FIGS. 7 to 10, is used.

Figure 11A:
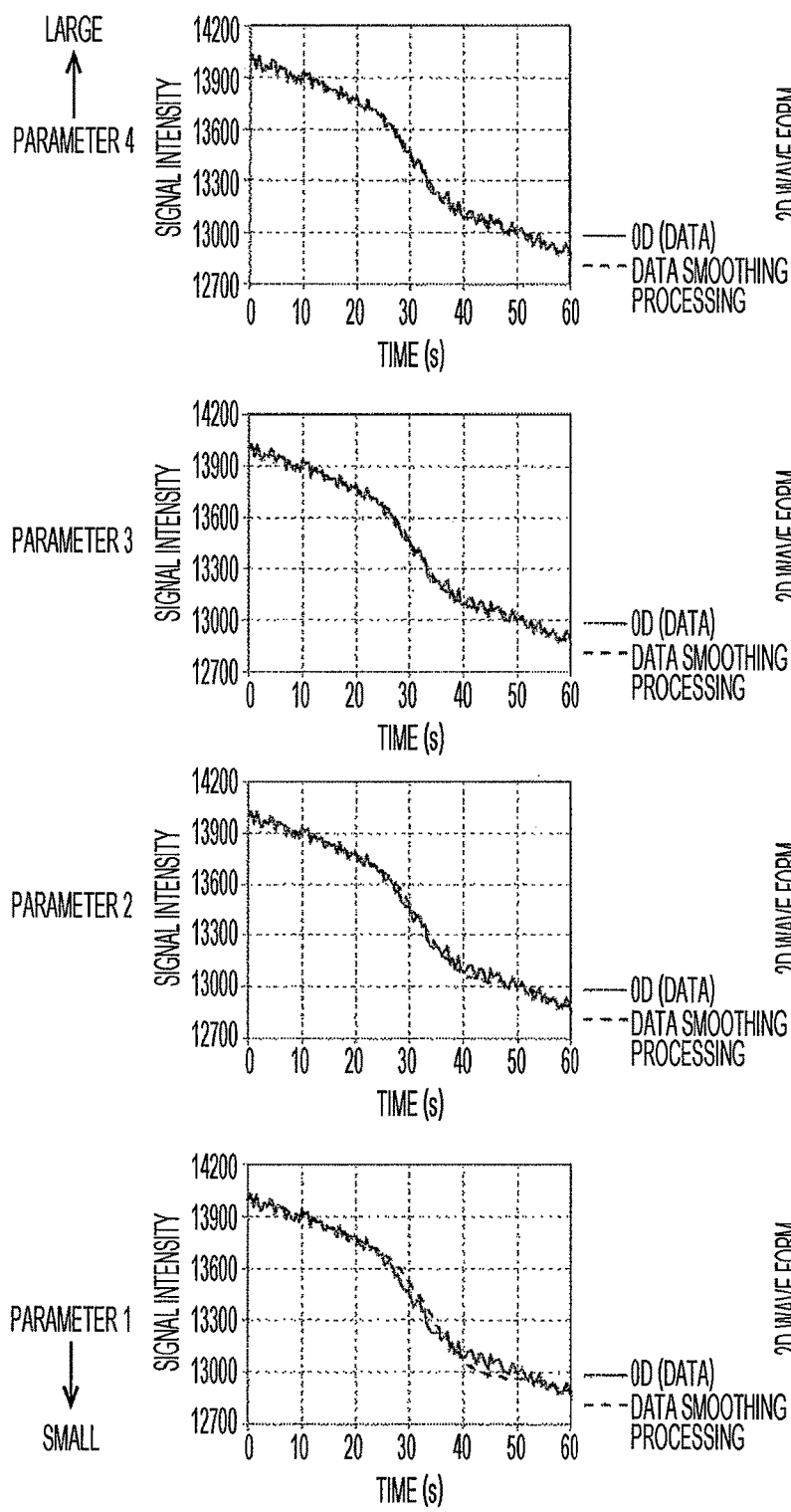
FIG. 11A illustrates input data ($Y1_t$) and a data smoothing processing result ($S1_t$) in a case where one parameter is sequentially changed in the type I adaptive double exponential smoothing method (N=0)
Figure 11B:
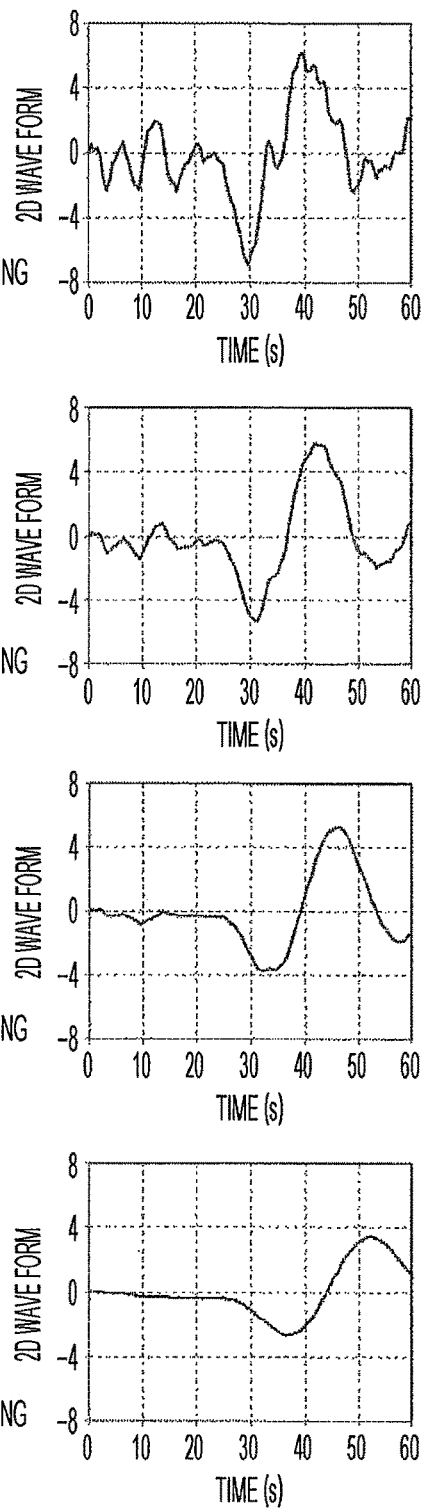
FIG. 11B illustrates a second order differential processing result ($B2_t$) in a case where the one parameter is sequentially changed in the type I adaptive double exponential smoothing method (N=0)

FIG. 11A illustrates input data ($Y1_t$) and data smoothing processing results ($S1_t$) in a case where a parameter in the type I adaptive double exponential smoothing method is sequentially changed. FIG. 11B illustrates second order differential processing results ($B2_t$) in a case where the parameter in the type I adaptive double exponential smoothing method is sequentially changed. A numerical value increases in order of parameters 1, 2, 3, and 4. In a case of the parameter 4 that is the largest numerical value, an input data wave form and a data smoothing wave form substantially fit to each other. It can be found that fitness is excellent. In a second order differential wave form, zero cross time is fast and responsiveness is excellent. However, it can be found that an S/N ratio is not excellent due to much noise. Meanwhile, in a case of the parameter 1 that is the smallest numerical value, a data smoothing wave form includes overshoot with respect to the input wave form. Thus, it can be found that fitness is not excellent and responsiveness is not excellent. In a second order differential wave form, noise is small and signal intensity is also small. It can be found that zero cross time is slow and delay time is large. According to second order differential wave forms in FIG. 11B, it can be determined that a case of the parameter 2 is a case where the S/N ratio and the delay time are compatible with each other.

Figure 12:
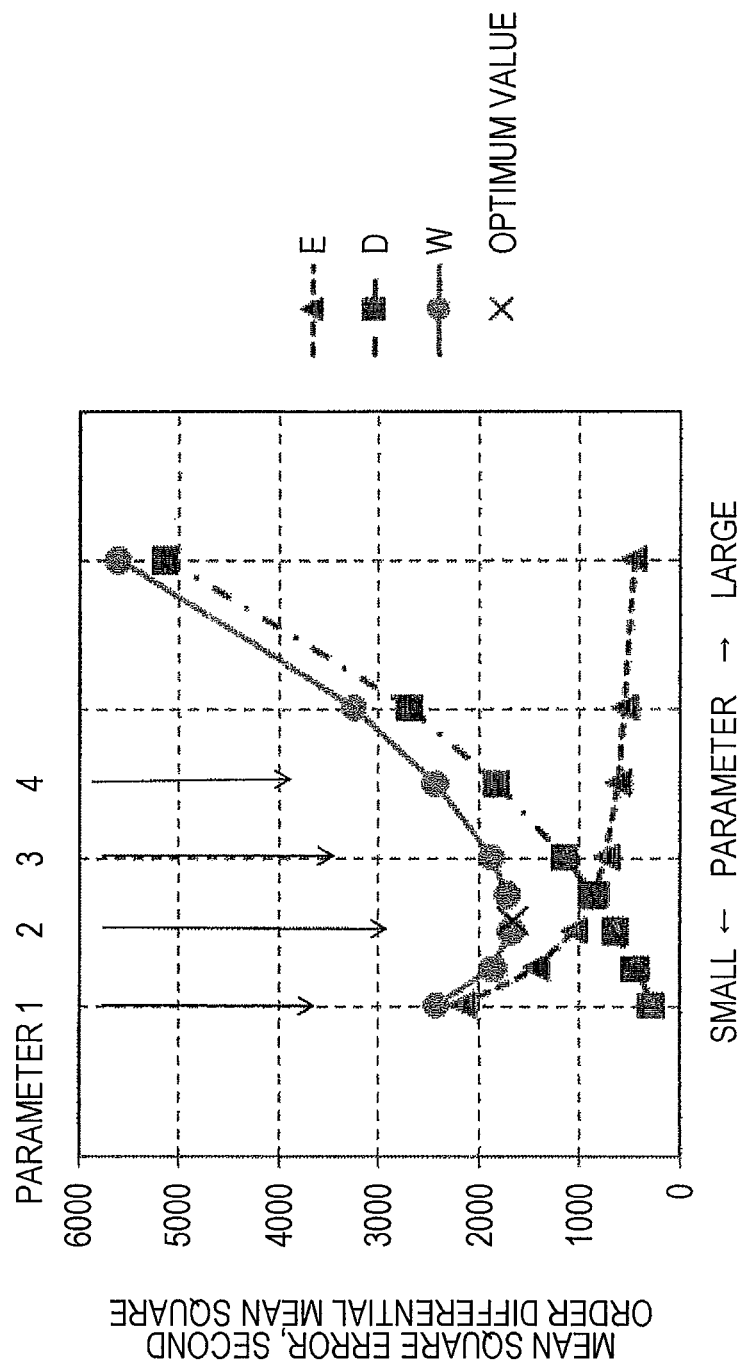
FIG. 12 is a graphical representation illustrating pieces of parameter dependency of E defined as a mean square error, D defined as a mean square of a second order differential, and W defined as an evaluation function, in a case of FIG. 11.
Figure 13A:
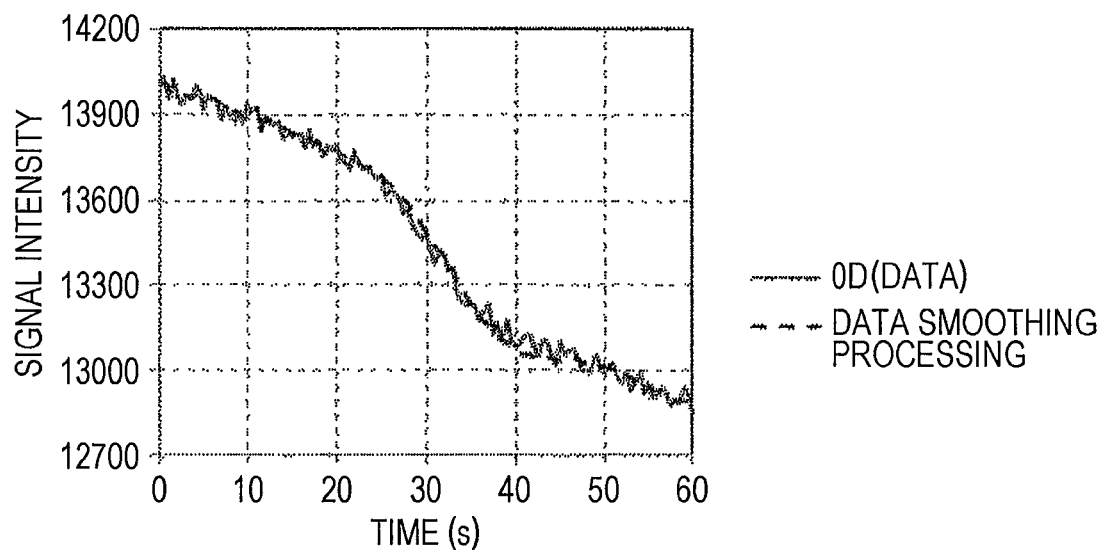
FIG. 13A illustrates the input data ($Y1_t$) and the data smoothing processing result ($S1_t$) with a parameter at a position of a mark x automatically derived using the evaluation function W in a case of FIG. 12.
Figure 13B:
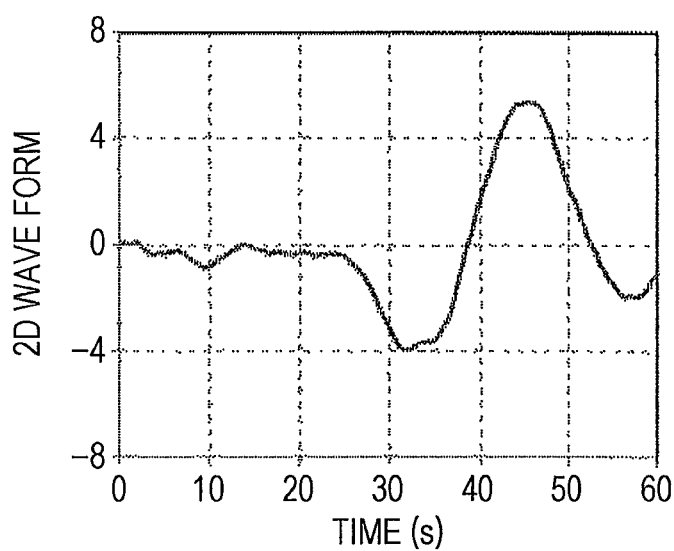
FIG. 13B illustrates the second order differential processing result ($B2_t$) with the parameter at the position of a mark x automatically derived using the evaluation function W in the case of FIG. 12.

FIG. 12 is a graphical representation illustrating pieces of parameter dependency of the mean square error E, the second order differential mean square D, and the evaluation function W, in a case of FIG. 11. Positions corresponding to the parameters in FIGS. 11A and 11B are illustrated by arrows. An x mark indicates a position of a parameter and a numerical value of the evaluation function W at which the evaluation function W automatically derived by using a gradient method, such as a steepest descent method, becomes a minimum value. In a case where a parameter at the position of the x mark in FIG. 12 is used, the parameter being automatically derived by using the evaluation function W, FIG. 13A illustrates input data ($Y1_t$) and a data smoothing processing result ($S1_t$) and FIG. 13B illustrates a second order differential processing result ($B2_t$).

As illustrated in FIG. 12, it can be found that, as the numerical value of the parameter increases, the mean square error E decreases and the second order differential mean square D increases. As a result, it can be found that the evaluation function W has the minimum value. As a result, it can be found that acquiring the minimum value of the evaluation function W can determine a parameter with which the S/N ratio and the responsiveness are compatible with each other. The pieces of parameter dependency of qualitative data processing wave form characteristics illustrated in FIGS. 11A and 11B, are quantitatively illustrated in FIG. 12.

The optimum value of the parameter with the x mark illustrated in FIG. 12 substantially corresponds to the parameter 2. It can be found that the data smoothing processing wave form and the data second order differential processing wave form illustrated in FIG. 13 substantially correspond to the data smoothing processing wave form and the data second order differential wave form with the parameter 2 illustrated in FIG. 12, respectively.

According to the present embodiment, the descriptions in which one parameter has been changed, has been given for convenience. A plurality of parameters can be derived by using a gradient method, such as a steepest descent method. In this case, in consideration of whether there is a local minimum value (optimum value), initial values of the parameters and a searching range are required to be examined. According to the embodiment, for convenience, the descriptions have been given in a case of a simple type I adaptive double exponential smoothing method. The above data processing methods, such as the type II, the type III, the type IV, the type V, and the type VI, or other data smoothing processing, such as the simple exponential smoothing method (exponential weighted moving average: EWMA), an adaptive simple exponential smoothing method, a low pass filter, and a Kalman filter, or data differential processing, such as the difference method, can find an optimum parameter at which an S/N ratio and responsiveness are compatible with each other, by similarly minimizing an evaluation function W.

According to the present embodiment, a second order differential value of the data smoothing processing result has been used for the second order differential mean square D in Expressions (66) and (67). A second order differential mean square of a first order differential processing result or a second order differential processing result, may be used. In this case, curve smoothness of a first order differential wave form and curve smoothness of a second order differential wave form are individually and directly evaluated. In this case, when compared to the data smoothing processing result, the first differential processing result and the second order differential result sequentially decreases in terms of an absolute value of a numerical value. Thus, adjustment for increasing coefficients λ in Expressions (66) and (67) is required.

In the adaptive simple exponential smoothing method by Expressions (1) to (4) described in James W Taylor, Journal of Forecasting, 2004, (23), pp 385-394, the input data $Y1_t$ at current time t and the predicted value $S1_t$ of smoothing of data at current time t are used so as to derive the predicted value $S_{t+1}$ of smoothing of data at one-period ahead time t+1. Meanwhile, in the type I to type VI embodiments, the input data $Y1_t$ at current time t and the predicted value $S1_{t-1}$ of smoothing of data at one-period previous time t–1 are used so as to derive the predicted value $S1_t$ of smoothing of data at current time t. The first one can be referred to as "one-period prediction" and the second one can be referred to as "current estimation". Even in a case of the type I to type VI embodiments, the "current estimation" may be changed to the "one-period prediction" by, for example, conversion from $S1_{t-1}$ to $S1_t$ or from $S1_t$ to $S1_{t+1}$.

Note that typically the "current estimation" is better than the "one-period prediction" in terms of accuracy of a predicted value of smoothing of data. James W Taylor, Journal of Forecasting, 2004, (23), pp 385-394 discloses the method for estimating an optimum smoothing parameter by minimizing a total sum of errors of a one-period predicted value by the "one-period prediction" simple exponential smoothing method.

In a case of the "current estimation", when a smoothing coefficient is set to be 1, $Y1_t=S1_t$ is satisfied. An error or a mean square error becomes zero. Thus, an optimum smoothing parameter cannot be estimated by using, for example, a steepest descent method. However, even when the "current estimation" is used, as illustrated in the embodiment, using the evaluation function W in Expression (66) taking a mean square error and curve smoothness into account can derive an optimum smoothing parameter.

According to the present embodiment, there is an effect that the optimum parameter for performing the data smoothing processing and the data differential processing to the input data can be automatically found in a short time without depending on knowledge and experience of data processing. Accordingly, there is an effect that a processing apparatus including the data processing apparatus, the data processing method, and the control apparatus for controlling the processing chamber, can be provided, the processing apparatus being easily used by general users, namely, having excellent usability.

As described above, the embodiment of the present invention is effective, for example, for, in particular, an etching process in a short time and for detecting an end point of etching accompanied with a change in a short time. The number of processes for etching multilayer thin films increases in semiconductor etching accompanied with high integration and miniaturization of semiconductor devices. Detecting an etching end point in each of an etching process in a short time and an etching step accompanied with a change in a short time, has been important.

For the short-time process and the short-time change process, according to an embodiment of the present invention, improving collective performance in which an S/N ratio improvement and responsiveness improvement are compatible with each other can detect a clear first order differential wave form and a clear second order differential wave form. Accordingly, an end point of etching can be determined with high precision. Based on this, a process in a plasma processing chamber is controlled so that micromachining can be performed to a semiconductor wafer with stable performance and high precision.

In the above embodiments, the detailed descriptions in which the data processing apparatus and the data processing method according to the embodiments of the present invention have been applied to detection of an etching end point in a microwave plasma etching apparatus and the etching has been performed with high precision, have been given. The data processing apparatus and the data processing method according to the embodiments of the present invention are applied to, for example, etching apparatuses and deposition apparatuses in other plasma generating methods (for example, inductive coupling type or parallel plate type) or processing apparatuses and other apparatuses in other fields, with numerical data acquired from, for example, the apparatuses as input data. As a result, a state of each of the apparatuses can be monitored and a change of the state can be detected with high precision. Accordingly, there is an effect that an apparatus to be an object can be controlled with high precision. There is an similar functional effect in control of other apparatuses.

Applying the data processing apparatus and the data processing method according to the embodiments of the present invention to economic and financial fields, such as supply and demand forecasting, causes an effect that data can be analyzed with high precision.

According to the embodiments of the present invention, in sequential data processing, data smoothing processing and data differential processing can be performed with a high S/N ratio and less data delay. During an initial period of data processing start, data processing can also performed with high reliability.

According to the embodiments of the present invention, a data smoothing value, a first order differential value, and a second order differential value can be sequentially acquired in real time with a high S/N ratio and short delay time, or with high reliability at the beginning of data processing start. According to the embodiments of the present invention, a system to be an object can be controlled with high precision by using the data smoothing value, the first order differential value, and the second order differential value.

The present invention is not limited to each of the above embodiments, and includes various modifications. For example, the above embodiments have been described in detail in order to easily understand the present invention. The present invention is not necessarily limited to including all the configurations having been described above. A part of a configuration in one of the embodiments can be replaced with a configuration in another embodiment. In addition, a configuration in one embodiment can be added to a configuration in another embodiment. With respect to a part of the configuration in each of the embodiments, additions, deletions, and replacements of the other configurations may be made.

What is claimed is:

1. A plasma processing apparatus comprising:
a chamber in which plasma processing is performed to a sample;
a radio frequency power source configured to supply radio frequency power for generating plasma in the processing chamber;
a data processing apparatus which, when executing a program to perform processing to light emission data of the plasma, configures the data processing apparatus to:
perform the processing to the light emission data by using an adaptive double exponential smoothing method, the adaptive double exponential smoothing method processing data, while varying a smoothing parameter based on an error between input data based on monitoring the light emission data and a predicted value of smoothed data;
smooth the input data by using a polynomial fitting method at a latest time of receiving the input data;
calculate the predicted value of smoothed data by using the smoothed input data;
perform a first order differential, by using a polynomial fitting method, to the predicted value of smoothed data;
calculate a predicted value of a slope of the smoothed data by using the predicted value of the smoothed data to which the first order differential is performed; and
derive a response coefficient of the smoothing parameter by using a probability density function including the error as a parameter; and
a system control apparatus configured to receive results of the processing to the light emission data and control the plasma processing apparatus by determining an etching end point.

2. The plasma processing apparatus according to claim 1, wherein the response coefficient of the smoothing parameter is derived by an N power of a value acquired by adding a constant to a predicted value of a relative value of the error, the predicted value being divided by a predicted value of an absolute value of the error, in a case where N is an integer of 0 or more.

3. A data processing apparatus connected to a plasma processing apparatus including a chamber in which plasma processing is performed to a sample and a radio frequency power source for generating plasma in the processing chamber,
the data processing apparatus which, when executing a program to perform processing to light emission data of the plasma, configures the data processing apparatus to:
perform the processing to the light emission data by using an adaptive double exponential smoothing method, the adaptive double exponential smoothing method processing data while varying a smoothing parameter based on an error between input data based on monitoring the light emission data and a predicted value of smoothed data;
smooth the input data by using a polynomial fitting method at a latest time of receiving the input data;
calculate the predicted value of the smoothed data by using the smoothed input data;
perform a first order differential, by using a polynomial fitting method, to the predicted value of smoothed data;
calculate a predicted value of a slope of the smoothed data by using the predicted value of the smoothed data to which the first order differential is performed; and
derive a response coefficient of the smoothing parameter by using a probability density function including the error as a parameter; and
a system control apparatus configured to receive results of the processing to the light emission data and control the plasma processing apparatus by determining an etching end point.

4. The data processing apparatus according to claim 3, wherein a response coefficient of the smoothing parameter is derived by an N power of a value acquired by adding a constant to a predicted value of a relative value of the error, the predicted value being divided by a predicted value of an absolute value of the error, in a case where N is an integer of 0 or more.

* * * * *